United States Patent
Asami et al.

(10) Patent No.: US 11,462,256 B2
(45) Date of Patent: Oct. 4, 2022

(54) MEMORY SYSTEM

(71) Applicant: Kioxia Corporation, Tokyo (JP)

(72) Inventors: Shohei Asami, Fujisawa (JP); Toshikatsu Hida, Yokohama (JP); Riki Suzuki, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/349,248

(22) Filed: Jun. 16, 2021

(65) Prior Publication Data

US 2022/0093169 A1 Mar. 24, 2022

(30) Foreign Application Priority Data

Sep. 18, 2020 (JP) .............................. JP2020-157798

(51) Int. Cl.
| | | |
|---|---|---|
| *G11C 11/40* | (2006.01) | |
| *G11C 11/406* | (2006.01) | |
| *G11C 16/16* | (2006.01) | |
| *G11C 16/10* | (2006.01) | |
| *G11C 16/34* | (2006.01) | |

(52) U.S. Cl.
CPC .. *G11C 11/40626* (2013.01); *G11C 11/40615* (2013.01); *G11C 16/102* (2013.01); *G11C 16/16* (2013.01); *G11C 16/3495* (2013.01)

(58) Field of Classification Search
CPC ........ G11C 11/40626; G11C 11/40615; G11C 6/102; G11C 16/16; G11C 16/3495
See application file for complete search history.

(56) References Cited

U.S. PATENT DOCUMENTS

| | | |
|---|---|---|
| 10,249,349 B2 | 4/2019 | Takizawa et al. |
| 2011/0205823 A1 | 8/2011 | Hemink et al. |
| 2017/0344299 A1 | 11/2017 | Ivanov |
| 2017/0345510 A1* | 11/2017 | Achtenberg ........ G06F 11/1048 |
| 2018/0277173 A1* | 9/2018 | Takizawa ........... G11C 16/3459 |
| 2019/0094927 A1* | 3/2019 | Kuwano ................ G06F 3/0653 |
| 2019/0146687 A1 | 5/2019 | Chien et al. |

FOREIGN PATENT DOCUMENTS

| | | |
|---|---|---|
| JP | 4701807 B2 | 6/2011 |
| TW | 201203273 A1 | 1/2012 |
| TW | 201801094 A | 1/2018 |

* cited by examiner

*Primary Examiner* — Han Yang
(74) *Attorney, Agent, or Firm* — Oblon, McClelland, Maier & Neustadt, L.L.P.

(57) ABSTRACT

According to one embodiment, a memory system includes a non-volatile memory and a memory controller. The non-volatile memory includes a plurality of groups, each including a plurality of memory cells. The memory controller is configured to determine whether to execute a refresh process for a first group based on whether a first temperature in a write process for the first group and a second temperature after the write process for the first group satisfy a first condition.

20 Claims, 17 Drawing Sheets

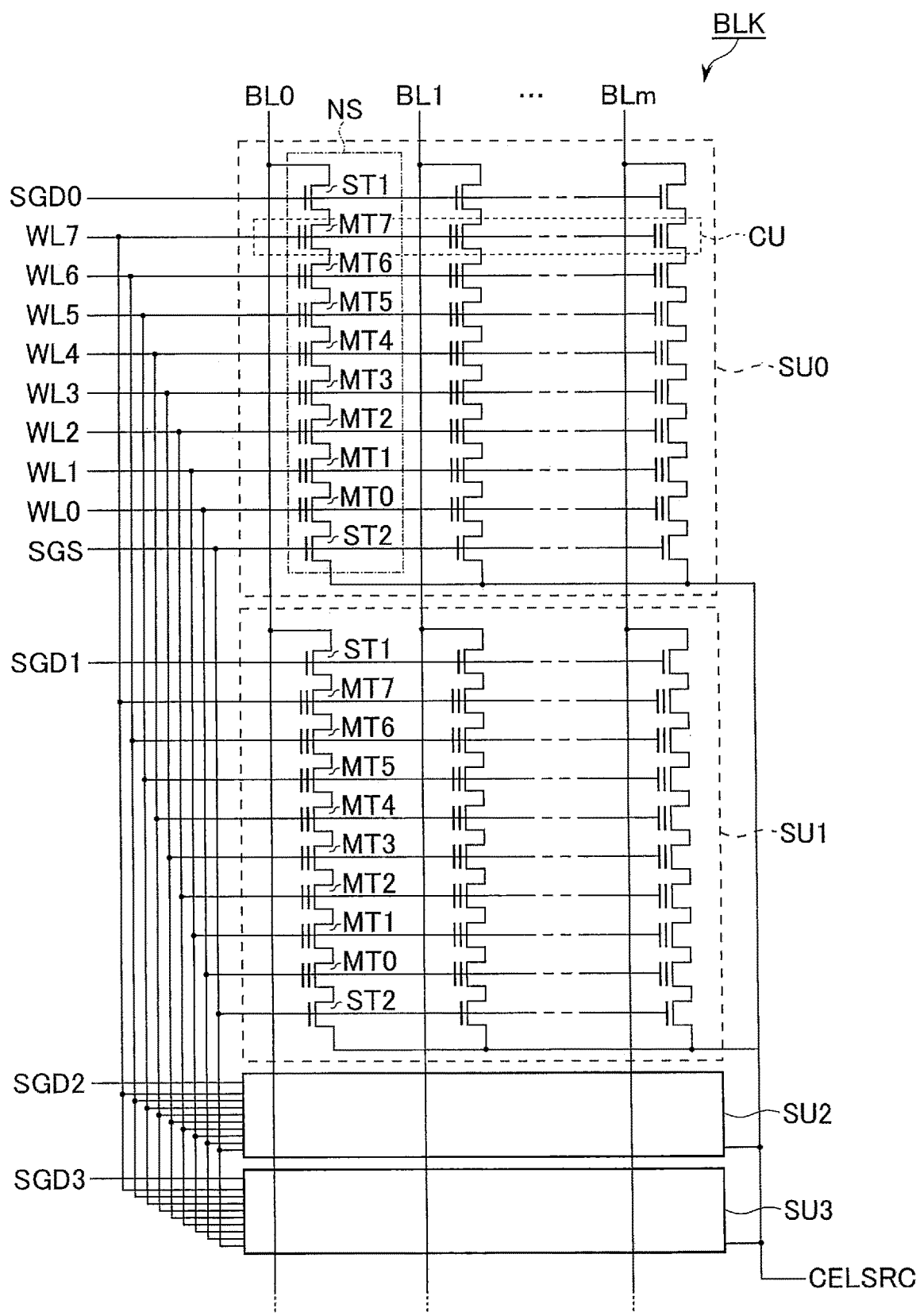
F I G. 3

| Chip | Block | Word line | Low-temperature flag |
|---|---|---|---|
| Chip0 | BLK0 | WL0 | True |
| | | WL1 | True |
| | | WL2 | True |
| | | WL3 | True |
| | | WL4 | True |
| | | WL5 | True |
| | | WL6 | False |
| | | WL7 | False |
| | BLK1 | WL0 | ⋮ |
| | | ⋮ | ⋮ |
| | | WL7 | ⋮ |
| | ⋮ | ⋮ | ⋮ |
| Chip1 | ⋮ | ⋮ | ⋮ |
| ⋮ | ⋮ | ⋮ | ⋮ |

21

F I G. 6

22

| Refresh reserved area |
|---|
| Chip0-BLK0 |
| Chip0-BLK1 |
| ⋮ |

F I G. 7

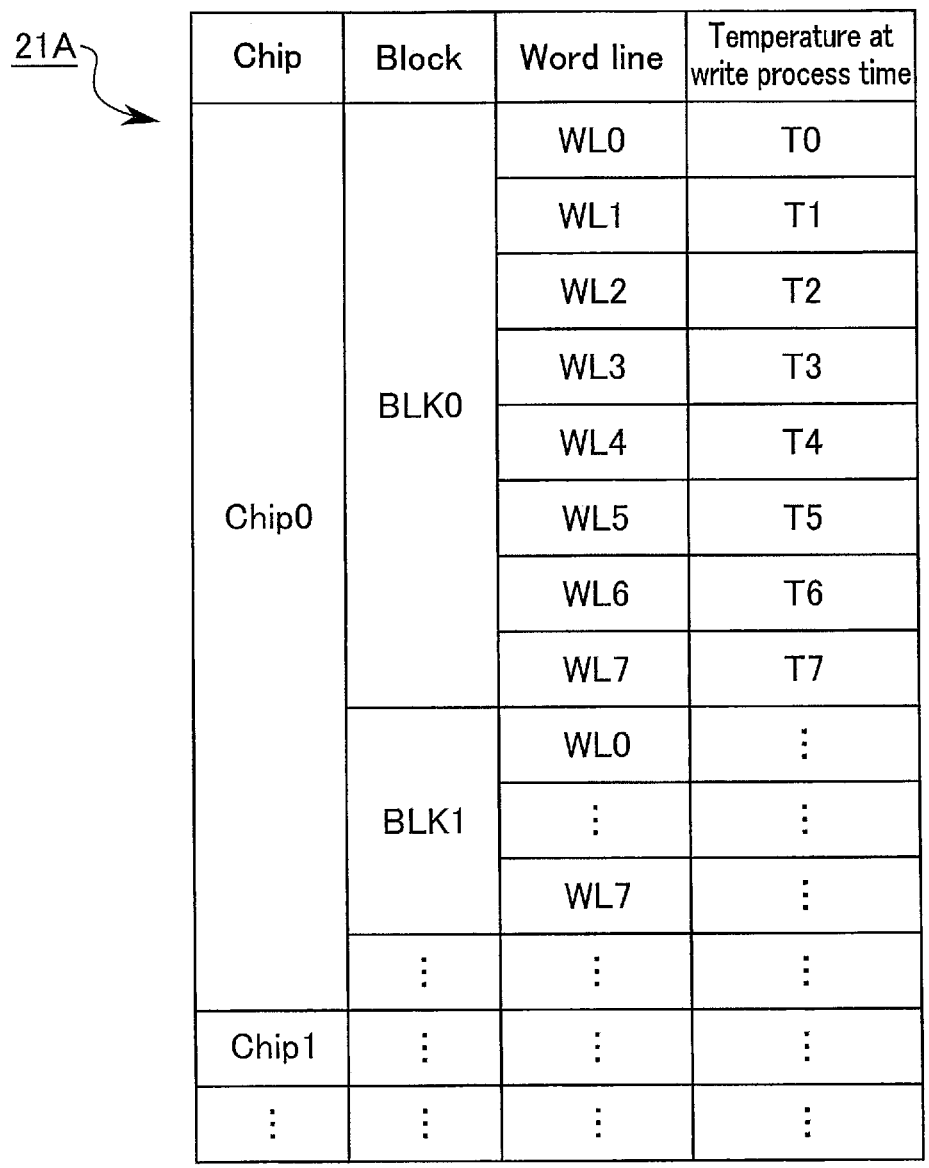
F I G. 11

21B

| Chip | Block | Word line | Temperature at write process time | Exclusion flag |
|---|---|---|---|---|
| Chip0 | BLK0 | WL0 | T0 | False |
| | | WL1 | T1 | False |
| | | WL2 | T2 | False |
| | | WL3 | T3 | True |
| | | WL4 | T4 | True |
| | | WL5 | T5 | False |
| | | WL6 | T6 | False |
| | | WL7 | T7 | False |
| | BLK1 | WL0 | ⋮ | ⋮ |
| | | ⋮ | ⋮ | ⋮ |
| | | WL7 | ⋮ | ⋮ |
| | ⋮ | ⋮ | ⋮ | ⋮ |
| Chip1 | ⋮ | ⋮ | ⋮ | ⋮ |
| ⋮ | ⋮ | ⋮ | ⋮ | ⋮ |

FIG. 14

MEMORY SYSTEM

CROSS-REFERENCE TO RELATED APPLICATIONS

This application is based upon and claims the benefit of priority from Japanese Patent Application No. 2020-157798, filed Sep. 18, 2020, the entire contents of which are incorporated herein by reference.

FIELD

Embodiments described herein relate generally to a memory system.

BACKGROUND

A memory system that includes a NAND-type flash memory which functions as a non-volatile memory, and a memory controller configured to control the non-volatile memory has been known.

BRIEF DESCRIPTION OF THE DRAWINGS

FIG. 3 is a circuit diagram for explaining a configuration of a memory cell array according to the first embodiment.

FIG. 6 is a conceptual diagram for explaining temperature management information of the memory system according to the first embodiment.

FIG. 7 is a conceptual diagram for explaining refresh reservation information of the memory system according to the first embodiment.

FIG. 11 is a conceptual diagram for explaining temperature management information of a memory system according to a second embodiment.

FIG. 14 is a conceptual diagram for explaining temperature management information of a memory system according to a third embodiment.

DETAILED DESCRIPTION

In general, according to one embodiment, a memory system includes a non-volatile memory and a memory controller. The non-volatile memory includes a plurality of groups, each including a plurality of memory cells. The memory controller is configured to determine whether to execute a refresh process for a first group based on whether a first temperature in a write process for the first group and a second temperature after the write process for the first group satisfy a first condition.

Hereinafter, embodiments will be described with reference to the drawings. In the description below, constitution elements having the same functions and configurations will be denoted by a common reference symbol. To distinguish a plurality of constitution elements having a common reference symbol from each other, an additional symbol is added after the common reference symbol. If the constitution components need not be particularly distinguished from each other, only the common reference symbols are used, without an additional symbol.

1. First Embodiment

A memory system according to a first embodiment will be described.

1.1 Configuration

The first embodiment will be described. In the following, a memory system that includes a NAND flash memory as a non-volatile memory will be described.

1.1.1 Memory System

First, a configuration including the memory system will be described with reference to FIG. 1.

Figure 1:
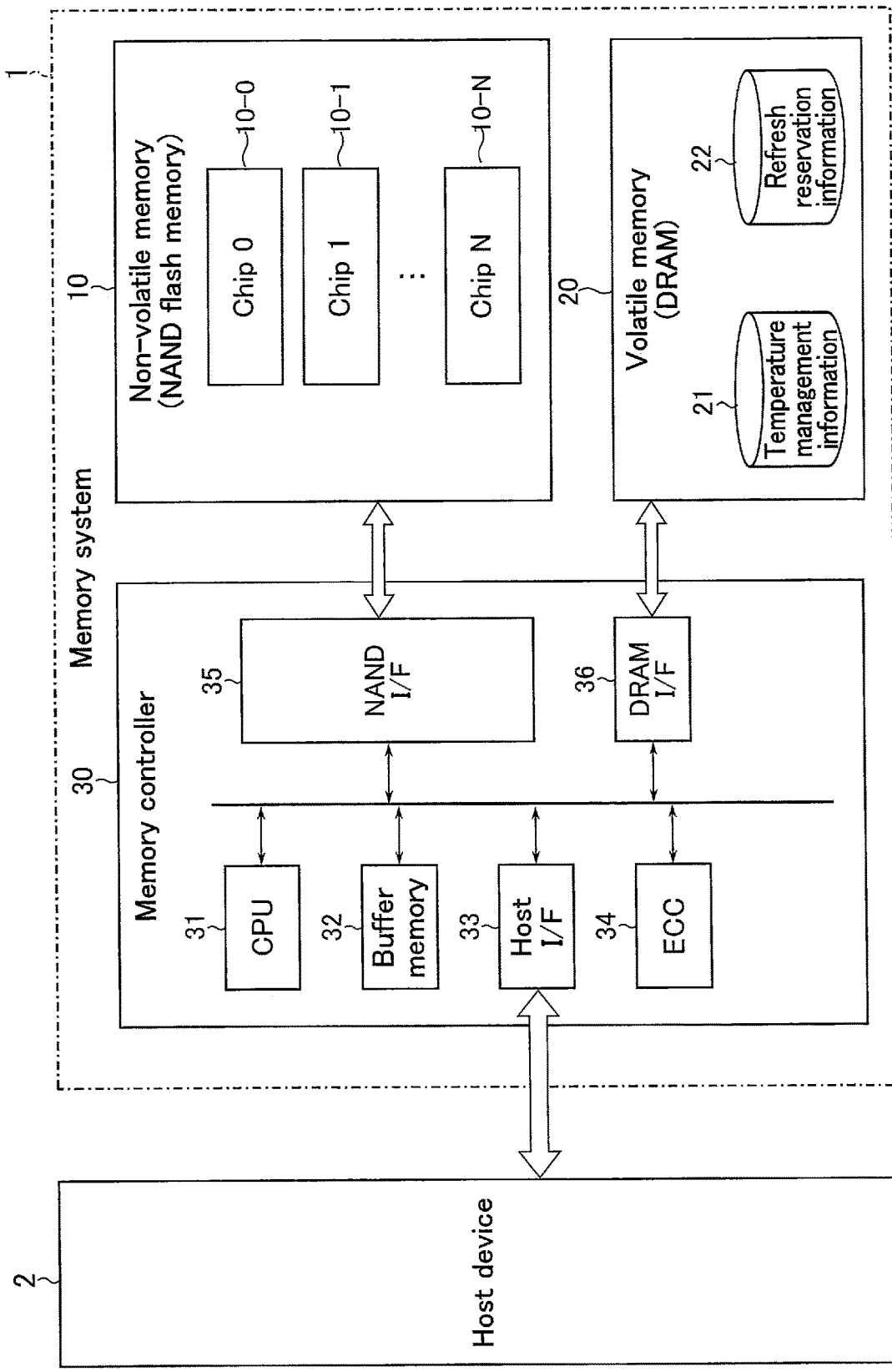
FIG. 1 is a block diagram for explaining a configuration of a memory system according to a first embodiment.

As shown in FIG. 1, a memory system 1 is coupled to an external host device 2, and configured to execute various operations in accordance with instructions from the host device 2. The memory system 1 includes a non-volatile memory 10, a volatile memory 20, and a memory controller 30. The non-volatile memory 10, the volatile memory 20, and the memory controller 30 may be, for example, combined to configure a single semiconductor device; examples of such a configuration include a memory card such as an SD™ card, a universal flash storage (UFS) device, and a solid state drive (SSD).

The non-volatile memory 10 (hereinafter referred to as the NAND flash memory 10) includes, for example, a plurality of chips 10-0 to 10-N, each including a plurality of memory cells (N is one or a greater integer). The NAND flash memory 10 non-volatilely stores data instructed by the host device 2 to be written. Furthermore, the NAND flash memory 10 outputs to the host device 2 via the memory controller 30 data instructed by the host device 2 to be read.

The volatile memory 20 is, for example, a dynamic random access memory (DRAM) and stores firmware for managing the NAND flash memory 10, and various management information. The volatile memory 20 is hereinafter referred to as the DRAM 20. The DRAM 20 also stores, for example, temperature management information 21 and refresh reservation information 22 as information for use in suppressing deterioration of the reliability of data stored in the NAND flash memory 10.

As the temperature management information 21, a storage area of the NAND flash memory 10 in which data has been stored and information relating to temperature at which the data has been written are stored in association with each other.

The refresh reservation information 22 stores a list of storage areas where a refresh process is to be performed among the storage areas of the NAND flash memory 10 in which data has been written.

The refresh process includes, for example, writing data, which has been written in a storage area in the NAND flash memory 10, into another storage area after executing an error correction process (described later), thereby reducing the number of errors (e.g., the number of error bits) to be detected in data when the data is read out.

The memory controller 30 includes a processor (CPU) 31, a buffer memory 32, a host interface circuit 33, an error checking and correction (ECC) circuit 34, a NAND interface circuit 35, and a DRAM interface circuit 36. The functions of each of the components 31 to 36 of the memory controller 30, which will be described in the following, may be realized by dedicated hardware, a program (firmware), or a combination of hardware resources and firmware.

The processor 31 controls the overall operation of the memory controller 30 by loading firmware stored in a read only memory (ROM) into a random access memory (RAM) and executing the firmware. For example, upon receipt of a write request from the host device 2, the processor 31 performs, in response thereto, a write process. Similar process is performed at the time of a read process and an erase process.

The buffer memory 32 is, for example, a static random access memory (SRAM), and temporarily stores data that the memory controller 30 reads from the NAND flash memory 10, and data received from the host device 2.

The host interface circuit 33 is coupled to the host device 2 via a host bus, and conducts communications between the memory controller 30 and the host device 2. The host bus is a bus compliant with, for example, an SD™ interface, a serial attached SCSI (small computer system interface) (SAS), a serial ATA (advanced technology attachment) (SATA), or PCI (peripheral component interconnect) Express™ (PCIe).

The ECC circuit 34 performs an error detection process and an error correction process on data read from the NAND flash memory 10. In other words, the ECC circuit 34 generates an error correction code and provides data with the error correction code in a write process, and decodes the error correction code in a read process, so as to detect whether there is an error bit. If an error bit is detected, the ECC circuit 34 specifies the location of the error bit and corrects the error bit. The method for the error correction includes, for example, hard bit decoding (hard decision decoding) and soft bit decoding (soft decision decoding). As a code for use in the hard decision decoding, a Bose-Chaudhuri-Hocquenghem (BCH) code, a Reed-Solomon (RS) code, or the like may be used. As a code for use in the soft decision decoding, a low density parity check (LDPC) or the like may be used.

The NAND interface circuit 35 is coupled to the NAND flash memory 10 via a NAND bus to conduct communications with the NAND flash memory 10. The NAND interface circuit 35 controls the transfer of data, commands, and addresses between the memory controller 30 and the NAND flash memory 10, and can independently control the chips 10-0 to 10-N in the NAND flash memory 10. The NAND interface circuit 35 complies with NAND interface standards.

The DRAM interface circuit 36 is coupled to the DRAM 20, and controls communications between the memory controller 30 and the DRAM 20. The DRAM interface circuit 36 complies with DRAM interface standards.

1.1.2 Chip

Figure 2:
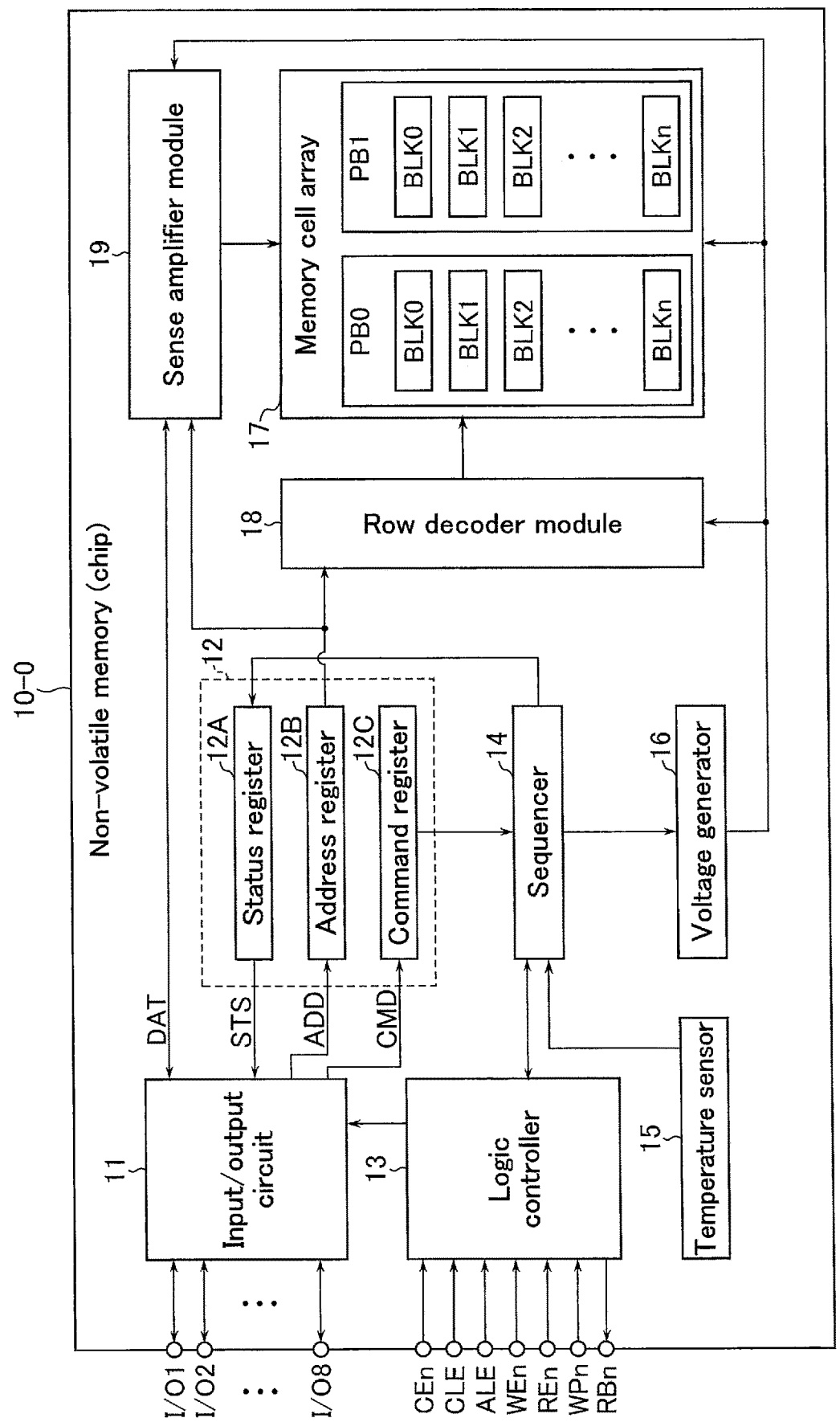
FIG. 2 is a block diagram for explaining a configuration of a non-volatile memory according to the first embodiment.

Next, a configuration of a chip in the non-volatile memory will be described with reference to FIG. 2. FIG. 2 shows a configuration of the chip 10-0 as an example. Since the chips 10-1 to 10-N, which are the chips other than the chip 10-0, have the same configuration as that of chip 10-0, descriptions of the chips 10-1 to 10-N will be omitted.

As shown in FIG. 2, the chip 10-0 includes, for example, an input/output circuit 11, a register set 12, a logic controller 13, a sequencer 14, a temperature sensor 15, a voltage generator 16, a memory cell array 17, a row decoder module 18, and a sense amplifier module 19.

The input/output circuit 11 transmits and receives input/output signals I/O1 to I/O8 of 8-bits width, for example, to and from the memory controller 30. The input/output signal I/O may include data DAT, a status STS, an address ADD, and a command CMD. The input/output circuit 11 also transmits and receives the data DAT to and from the sense amplifier module 19.

The register set 12 includes a status register 12A, an address register 12B, and a command register 12C. The status register 12A, the address register 12B, and the command register 12C respectively store the status STS, the address ADD, and the command CMD.

The status STS is updated in accordance with, for example, an operation state of the sequencer 14. The status STS is transferred from the status register 12A to the input/output circuit 11 based on instructions from the memory controller 30, and output to the memory controller 30. The address ADD is transferred from the input/output circuit 11 to the address register 12B, and may include, for example, a chip address, a block address, a page address, and a column address. The command CMD is transferred from the input/output circuit 11 to the command register 12C, and includes commands for various operations of the chip 10-0.

The logic controller 13 controls the input/output circuit 11 and the sequencer 14 on the basis of control signals received from the memory controller 30. Such control signals include, for example, a chip enable signal CEn, a command latch enable signal CLE, an address latch enable signal ALE, a write enable signal WEn, a read enable signal REn, and a write protect signal WPn. The logic controller 13 notifies the memory controller 30 of a control signal, for example a ready/busy signal RBn, which is received from the sequencer 14.

The chip enable signal CEn is a signal to enable the chip 10-0. The command latch enable signal CLE is a signal to notify the input/output circuit 11 that a received input/output signal I/O is a command CMD. The address latch enable signal ALE is a signal to notify the input/output circuit 11 that a received input/output signal I/O is an address ADD. The write enable signal WEn is a signal to instruct the input/output circuit 11 to input therein an input/output signal I/O. The read enable signal REn is a signal to instruct the input/output circuits 11 to output therefrom an input/output signal I/O. The write protect signal WPn is a signal to place the chip 10-0 in a protected state when the power is turned on or off.

The ready/busy signal RBn is a signal to notify the memory controller 30 of whether the chip 10-0 is in a ready state or in a busy state. In the present application, "the ready state" indicates that the chip 10-0 is ready to accept a command from the memory controller 30, and "the busy state" indicates that the chip 10-0 is not ready to accept a command from the memory controller 30.

The sequencer 14 controls the entire operation of the chip 10-0. For example, the sequencer 14 performs a read process, a write process, and an erase process based on a command CMD stored in the command register 12C and an address ADD stored in the address register 12B. The sequencer 14 causes the status register 12A to store, for example, temperature information acquired from the temperature sensor 15 as a status STS, and outputs the temperature information to the memory controller 30 via the input/output circuit 11. The temperature information may be output to the memory controller 30 not as the status STS but as information other than the status STS.

The temperature sensor 15 is provided in the chip 10-0, and measures temperature of, for example, the memory cell array 17. The temperature sensor 15 sends information regarding the measured temperature to the sequencer 14. The temperature sensor 15 may not directly measure temperature of the memory cell array 17. The temperature sensor 15 may measure temperature of, for example, a portion other than the memory cell array 17. In this case, the temperature of the memory cell array 17 may be estimated by the sequencer 14 based on the temperature measured by the temperature sensor 15.

The voltage generator 16 generates voltages for use in a read process, a write process, and an erase process, for example. The voltage generator 16 supplies the generated voltages to the memory cell array 17, the row decoder module 18, and the sense amplifier module 19.

The memory cell array 17 includes a plurality of planes PB. The plurality of planes PB in the example shown in FIG. 2 includes two planes PB0 and PB1. Each of the planes PB includes a plurality of blocks BLK0 to BLKn (where n is one or a greater integer). The planes PB are operable in parallel to one another. A block BLK is a group of a plurality of memory cell transistors configured to store data in a non-volatile manner, and is used as, for example, a unit for an erase process. Each memory cell transistor is associated with a single bit line BL and a single word line WL.

The row decoder module 18 selects a block BLK, on which various processes are executed, based on a block address. The row decoder module 18 transfers a voltage supplied from the voltage generator 16 to the word line WL or the like in the selected block BLK.

The sense amplifier module 19 reads data from the memory cell array 17 in a read process, and transfers the read data to the input/output circuit 11. The sense amplifier module 19 applies a predetermined voltage to the bit line BL in a write process in accordance with data received from the input/output circuit 11.

1.1.3 Memory Cell Array

Next, a configuration of the memory cell array included in the chip of the non-volatile memory according to the first embodiment will be described.

FIG. 3 is an example of a circuit diagram showing a configuration of the memory cell array 17 according to the first embodiment. In FIG. 3, one block BLK in the memory cell array 17 is illustrated. As shown in FIG. 3, the block BLK includes, for example, four string units SU0 to SU3.

Each string unit SU includes a plurality of NAND strings NS that are respectively associated with bit lines BL0 to BLm (m is one or a greater integer). The NAND string NS includes, for example, memory cell transistors MT0 to MT7 and select transistors ST1 and ST2.

Each memory cell transistor MT includes a control gate and a charge storage layer, and stores data in a non-volatile manner. Each of the select transistors ST1 and ST2 is used to select a string unit SU at the time of performing various processes.

In each NAND string NS, memory cell transistors MT0 to MT7 are coupled in series. The select transistor ST1 is coupled between one end of the series of memory cell transistors MT0 to MT7 and the associated bit line BL. The drain of the select transistor ST2 is coupled to the other end of the series of memory cell transistors MT0 to MT7. The source of the select transistor ST2 is coupled to a source line CELSRC.

The gates of the select transistors ST1 included in string units SU0 to SU3 in the same block BLK are respectively coupled in common to select gate lines SGD0 to SGD3. The control gates of the memory cell transistors MT0 to MT7 are respectively coupled in common to word lines WL0 to WL7. The gates of the select transistors ST2 are respectively coupled in common to a select gate line SGS.

The bit lines BL0 to BLm are shared by a plurality of blocks BLK. The NAND strings NS corresponding to the same column address are coupled in common to the same bit line BL. A set of word lines WL0 to WL7 is provided for each block BLK. The source line CELSRC is, for example, shared by a plurality of blocks BLK.

A set of memory cell transistors MT coupled to a common word line WL in a single string unit SU is referred to as, for example, a cell unit CU and used as a unit for a write process. For example, a storage capacity of the cell unit CU including memory cell transistors MT each of which stores 1-bit data, is defined as "1-page data". The 1-page data is used as, for example, a unit for a read operation. The cell unit CU may have the storage capacity of two-or-more pages data in accordance with the number of bits of data stored in a memory cell transistor MT.

The above-described circuit configuration of the memory cell array 17 is a mere example, and is not limited thereto. For example, the number of string units SU included in each block BLK may be determined to be any number as appropriate. The number of the memory cell transistors MT and the number of the select transistors ST1 and ST2 included in each NAND string NS may be individually determined to be any numbers as appropriate.

1.1.4 Data Storage Method

The memory system 1 may use multiple types of write mode. For example, the memory system 1 can use a single-level cell (SLC) mode, a multi-level cell (MLC) mode, a triple-level cell (TLC) mode, or a quadruple-level cell (QLC) mode. The SLC mode, the MLC mode, the TLC mode, and the QLC mode are write modes for storing 1-bit data, 2-bit data, 3-bit data, and 4-bit data, respectively, in a single memory cell transistor MT.

Figure 4:
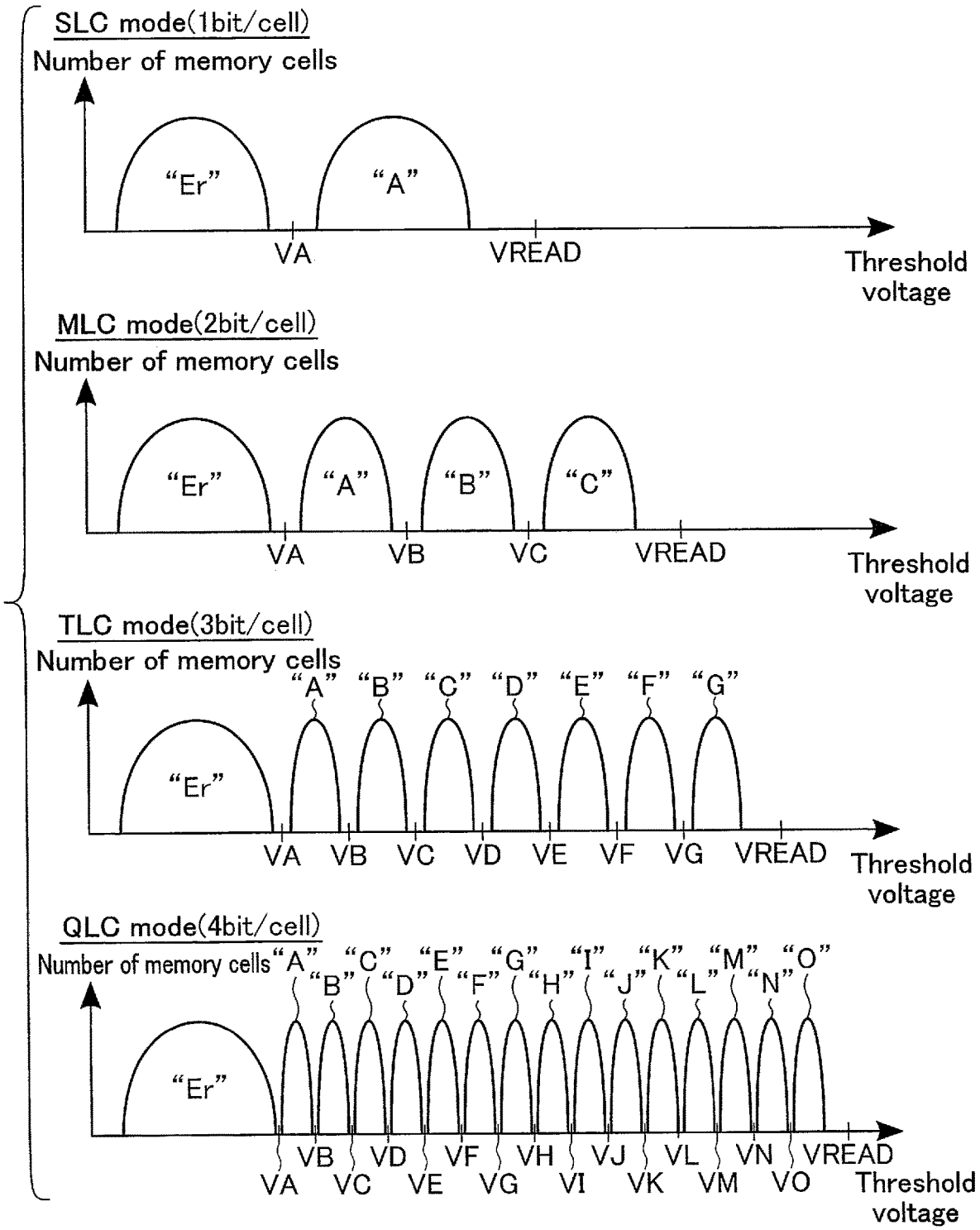
FIG. 4 is a schematic diagram for explaining threshold voltage distributions of memory cells according to the first embodiment.

FIG. 4 is an example of threshold voltage distributions of the memory cell transistors MT in the memory system 1 according to the first embodiment. FIG. 4 shows four types of the threshold voltage distribution and of read voltage groups when the SLC mode, the MLC mode, the TLC mode, and the QLC mode are used, respectively. In the threshold voltage distributions shown in FIG. 4, the vertical axis represents the number of memory cell transistors MT, and the horizontal axis represents the threshold voltage Vth of the memory cell transistors MT. As shown in FIG. 4, the plurality of memory cell transistors MT form a plurality of threshold voltage distributions in accordance with an applied write mode, in other words, the number of bits of stored data.

When the SLC mode (1 bit/cell) is used, the threshold voltages of the plurality of memory cell transistors MT form two threshold voltage distributions. These two distributions are respectively called, an "Er" state and an "A" state, from lower to higher threshold voltages. In the SLC mode, 1-bit data with different values are assigned to the "Er" state and the "A" state, respectively.

When the MLC mode (2 bit/cell) is used, the threshold voltages of the plurality of memory cell transistors MT form four threshold voltage distributions. These four distributions are respectively called, an "Er" state, an "A" state, a "B" state, and a "C" state, from lower to higher threshold voltages. In the MLC mode, 2-bit data with different values are assigned to the "Er" state to the "C" state, respectively.

When the TLC mode (3 bit/cell) is used, the threshold voltages of the plurality of memory cell transistors MT form eight threshold voltage distributions. These eight distributions are respectively called, an "Er" state, an "A" state, a "B" state, a "C" state, a "D" state, an "E" state, an "F" state, and a "G" state, from lower to higher threshold voltages. In the TLC mode, 3-bit data with different values are assigned to the "Er" state to the "G" state, respectively.

When the QLC mode (4 bit/cell) is used, the threshold voltages of the plurality of memory cell transistors MT form sixteen threshold voltage distributions. These sixteen distributions are respectively called, an "Er" state, an "A" state, a "B" state, a "C" state, a "D" state, an "E" state, an "F" state, a "G" state, an "H" state, an "I" state, a "J" state, a "K" state, an "L" state, an "M" state, an "N" state, and an "O" state, from lower to higher threshold voltages. In the QLC mode, 4-bit data with different values are assigned to the "Er" state to the "O" state, respectively.

In each write mode, a read voltage is set between two neighboring threshold distributions. Specifically, a read voltage VA is set between a maximum threshold voltage in the "Er" state and a minimum threshold voltage in the "A" state. Similarly, a read voltage VB is set between the "A" state and the "B" state. A read voltage VC is set between the "B" state and the "C" state. A read voltage VD is set between the "C" state and the "D" state. A read voltage VE is set between the "D" state and the "E" state. A read voltage VF is set between the "E" state and the "F" state. A read voltage VG is set between the "F" state and the "G" state. A read voltage VH is set between the "G" state and the "H" state. A read voltage VI is set between the "H" state and the "I" state. A read voltage VJ is set between the "I" state and the "J" state. A read voltage VK is set between the "J" state and the "K" state. A read voltage VL is set between the "K" state and the "L" state. A read voltage VM is set between the "L" state and the "M" state. A read voltage VN is set between the "M" state and the "N" state. A read voltage VO is set between the "N" state and the "O" state.

In each write mode, a read pass voltage VREAD is set to a voltage higher than a maximum threshold voltage of the highest threshold voltage distribution. A memory cell transistor MT to which the read pass voltage VREAD is applied is turned on, regardless of data stored therein.

The above-described number of bits of data stored in a single memory cell transistor MT is merely an example, and is not limited thereto. For example, 5-or-more bit data may be stored in the memory cell transistor MT. Each of the read voltages and the read pass voltage may be set at the same voltage value in each write mode, or may be set at different voltage values.

FIG. 4 illustrates in a case where the threshold voltage distributions do not overlap. Actually however, the threshold voltage distributions may vary and overlap due to various factors. In this case, erroneous data may be read from a memory cell transistor MT corresponding to an overlapping portion between two neighboring threshold distributions, which is not desirable.

Figure 5:
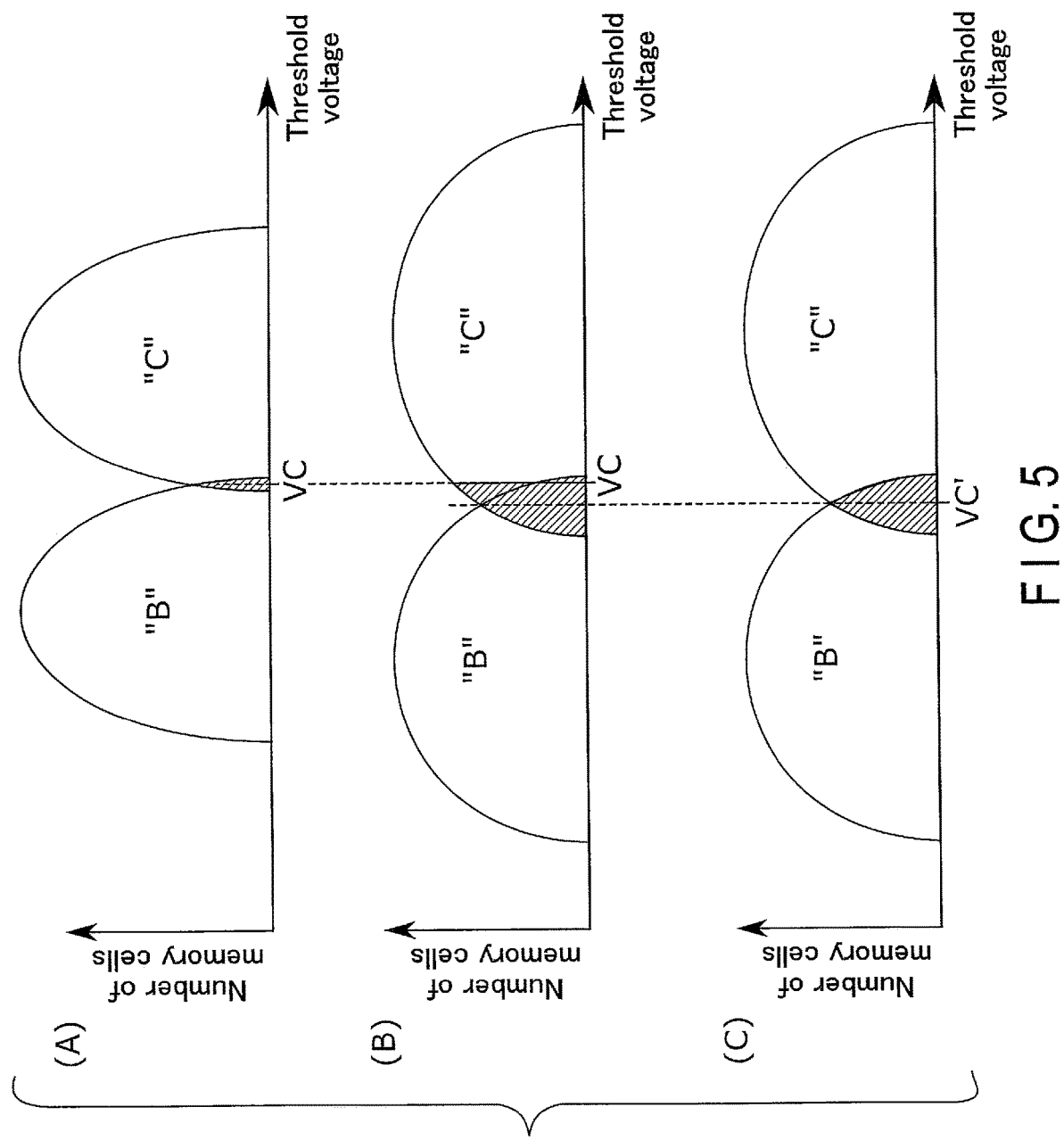
FIG. 5 is a schematic diagram for explaining changes in threshold voltage distributions due to a difference in temperatures between a write process and a read process in the memory system according to the first embodiment.

FIG. 5 is a schematic diagram showing the number of error bits due to the overlap of threshold voltages distributions of the memory cell transistors MT according to the first embodiment. In FIG. 5, it is assumed that the MLC mode is used as an example. FIG. 5 illustrates, by using two threshold voltage distributions corresponding to the "B" state and the "C" state as an example, variations of the threshold voltage distributions based on a difference in temperatures between a write process and a read process as an example of factors that vary the threshold voltage distributions. More specifically, FIG. 5 (A) shows a state of overlapping of the threshold voltage distributions in a case where the temperature in the write process and the temperature in the read process are equivalent (hereinafter referred to as case (A)). FIG. 5 (B) and FIG. 5 (C) respectively show states of overlapping of the threshold voltage distributions in cases where the temperature in the write process and the temperature in the read process are significantly different (hereinafter referred to as case (B) and case (C)).

As shown in FIG. 5 (A) to FIG. 5 (C), in the case (B) and case (C), the overlapping states of the threshold voltage distributions are considerably different from that in the case (A). The area of the shaded portions in each of FIG. 5 (A) to FIG. 5 (C) corresponds to the sum of the number of memory cell transistors MT that is determined to store data corresponding to the "B" state in error for the "C" state and the number of memory cell transistors MT that is determined to store data corresponding to the "C" state in error for the "B" state (hereinafter referred to as the number of error bits NE_BC). If the read voltage VC is set at a voltage corresponding to an intersection of the two threshold voltage distributions, the area can be the smallest. In the case (B), the voltage corresponding to the intersection of the two threshold voltage distributions changes from that in the case (A). Therefore, if data is read by using the read voltage VC, the number of error bits NE_BC, which corresponds to the area of the shaded portion in FIG. 5 (B), will be larger than that in the case (A).

Furthermore, as shown in FIG. 5 (A) to FIG. 5 (C), the two threshold voltage distributions in the case (C) is wider than that in the case (A). Therefore, even if the read voltage is re-set to a voltage VC' corresponding to the intersection of the two threshold voltage distributions in the case (C), the number of error bits NE_BC, which corresponds to the area of the shaded portion in FIG. 5 (C), will be larger than that in the case (A).

Thus, in the cases (B) and (C), since the number of error bits NE_BC is greater than that in the case (A), the possibility of failure in an error correction process by the ECC circuit 34 may be high, which is not desirable. To avoid such a situation, the memory controller 30 stores the temperature management information 21 to determine whether a refresh process is necessary, and stores a determination result in the refresh reservation information 22.

1.1.5 Temperature Management Information

Next, a configuration of the temperature management information according to the first embodiment will be described. FIG. 6 is a conceptual diagram illustrating an example of the configuration of the memory system 1 according to the first embodiment.

As shown in FIG. 6, in the temperature management information 21, a low-temperature flag is stored per each predetermined storage area (i.e., a temperature management unit) for all storage areas in the NAND flash memory 10. The low-temperature flag indicates whether the temperature of the memory cell array 17 was low, when data was written in the storage area of the corresponding temperature management unit. If the temperature of the memory cell array 17 when data is written is low, "True" is stored in the low-temperature flag, and if not, "False" is stored in the low-temperature flag. Whether the temperature is low or not is determined by the memory controller 30, for example, based on temperature information of the temperature sensor 15 sent from the NAND flash memory 10. In the low-temperature flag of a temperature management unit in which no data is written, for example, "False" is stored.

FIG. 6 shows an example in which the temperature management unit is a word line WL. More specifically, FIG. 6 shows a case in which one low-temperature flag is allocated to one cell unit CU (i.e., all of the memory cell transistors MT coupled to the same word line WL in the same block BLK).

In the example of FIG. 6, "True" is set to six low-temperature flags associated with the word lines WL0 to WL5 in the block BLK0 of the chip Chip0, while "False" is set to two low-temperature flags associated with the word lines WL6 and WL7. With reference to the information, the memory controller 30 recognizes that the memory cell array 17 was in a low-temperature state when data was written in the memory cells coupled to the word lines WL0 to WL5 in the block BLK0 in the chip Chip0. The memory controller 30 also recognizes that the memory cell array 17 was not in a low-temperature state when data was written in the memory cells coupled to the word lines WL6 and WL7 in the block BLK0 in the chip Chip0.

The configuration described above allows the memory controller 30 to ascertain the temperature states of all storage areas in the NAND flash memory 10 when data was written.

1.1.6 Refresh Reservation Information

Next, a configuration of the refresh reservation information according to the first embodiment will be described. FIG. 7 is a conceptual diagram illustrating an example of the configuration of the refresh reservation information 22 in the memory system 1 according to the first embodiment.

As shown in FIG. 7, the refresh reservation information 22 stores refresh process reserved areas of the storage areas in the NAND flash memory 10, for example, per unit of executing the refresh process. The execution units of the refresh process are, for example, blocks BLK. FIG. 7 shows that the refresh reservation information 22 stores information that the storage areas included in the block BLK0 and the block BLK1 of the chip Chip0 are reserved for the refresh process, when the execution units of the refresh process are blocks BLK.

The memory controller 30 refers to the refresh reservation information 22, thereby executing a refresh process, for example in the order of reservations in units of blocks BLK, on a reserved block BLK which may include a plurality of temperature management units. Note that the execution units of the refresh process are not limited to the blocks BLK, but may be temperature management units (e.g., word lines WL).

1.2 Operation

Next, an operation in the memory system according to the first embodiment will be described.

1.2.1 Update Process for Temperature Management Information

First, an update process for the temperature management information involved in a write process in the memory system according to the first embodiment will be described.

Figure 8:
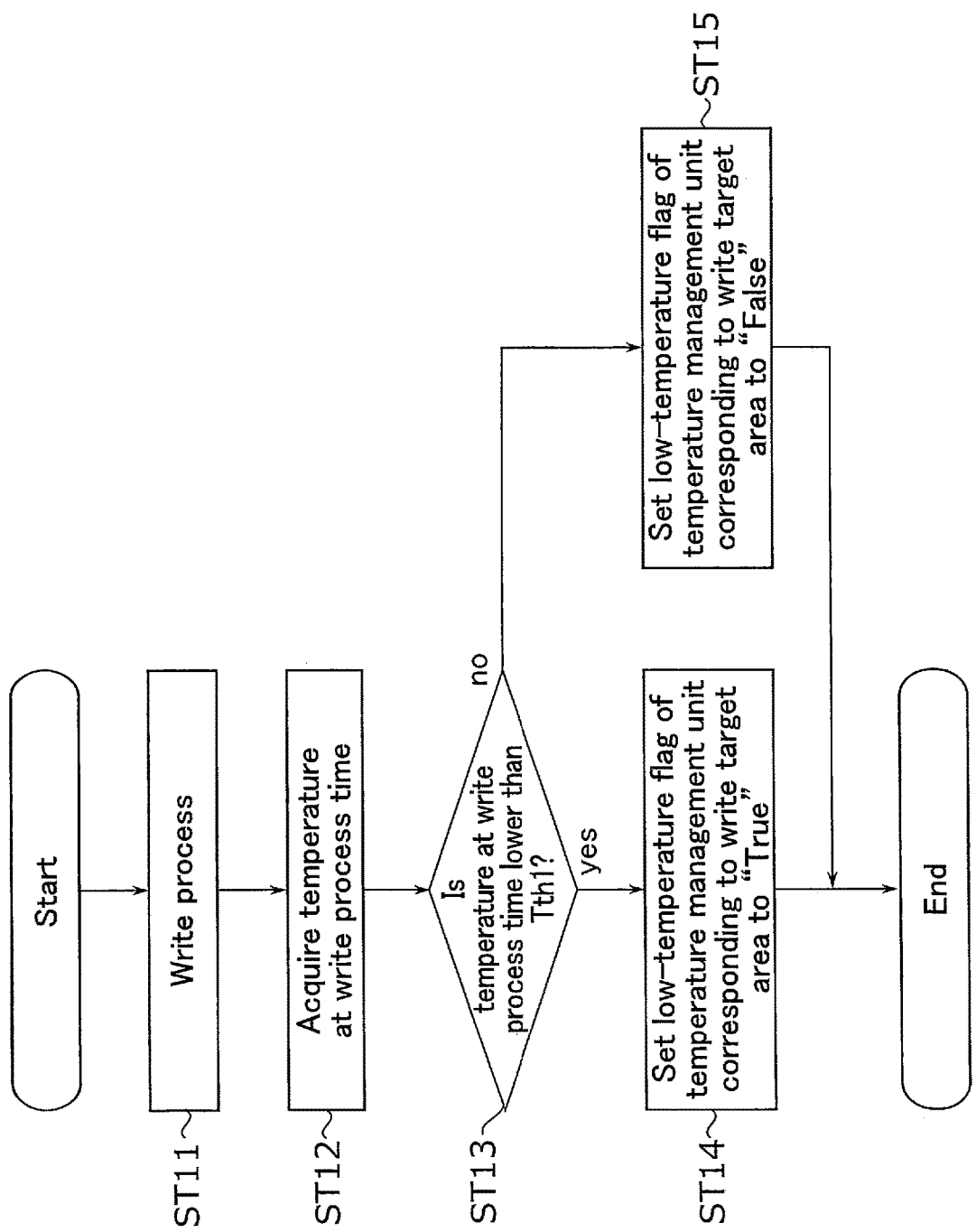
FIG. 8 is a flowchart for explaining an update process for the temperature management information in the memory system according to the first embodiment.

FIG. 8 is a flowchart showing an update process for the temperature management information 21 in the memory system according to the first embodiment.

As shown in FIG. 8, in step ST11, the memory system 1 performs a write process. Specifically, for example, the memory controller 30 issues a write command set in response to a write request from the host device 2, and sends it to the NAND flash memory 10. The write command set includes, for example, a command that instructs the NAND flash memory 10 to execute a write process, an address that specifies a storage area in which data is to be written, and the data that is to be written in the storage area. Upon receipt of the write command set, the NAND flash memory 10 writes the data included in the write command set in the storage area of the specified address.

In step ST12, the memory controller 30 acquires information on temperature at the time of the write process (hereinafter referred to as "the temperature at the write process time") from the NAND flash memory 10. Specifically, for example, the memory controller 30 issues a temperature read command, and sends it to the NAND flash memory 10. The temperature read command is, for example, a status read command. Upon receipt of the temperature read command, the NAND flash memory 10 sends information on the temperature measured by the temperature sensor 15 to the memory controller 30.

In the example of FIG. 8, the process of step S12 is executed after the process of step S11; however, the embodiment is not limited to this example. The process of step ST12 may be executed, for example, in parallel with the execution of the process of step ST11; the timing for obtaining the temperature during the write process may be any timing during the execution of the write process. Furthermore, for example, the process of step ST12 may be performed before the process of step ST11.

The memory controller 30 may acquire the temperature at the write process time, for example each time the write process for one word line WL is executed. In this case, since the write process for one word line WL is completed in several milliseconds, a significant difference may not occur at whichever timing in the write process the temperature is obtained. Therefore, the memory controller 30 may acquire, as the temperature at the write process time, temperature measured once at certain timing in the write process for the one word line WL.

Furthermore, for example, the memory controller 30 may acquire the temperature at the write process time, each time the write process for one block BLK is executed. In this case, the temperature may vary significantly during the write process. Therefore, the memory controller 30 may acquire a plurality of temperatures measured at a plurality of certain timings during the write process for the one block BLK (for example, at the start and the end of the write process). In that case, the memory controller 30 may use an average value of the plurality of acquired temperatures as the temperature at the write process time. Alternatively, the memory controller 30 may use, as the temperature at the write process time, a lowest value of the plurality of temperatures measured at a plurality of predetermined timings during the write process for the one block BLK.

In step ST13, the memory controller 30 determines whether or not the temperature at the write process time acquired in step ST12 is lower than a threshold value Tth1. The memory controller 30 uses the threshold value Tth1 as a threshold to determine whether the temperature at the write process time is low or not.

If the temperature at the write process time is lower than the threshold value Tth1 (step ST13; yes), the memory controller 30 determines that the temperature at the write process time is low, and the process proceeds to step ST14. In step ST14, the memory controller 30 sets the low-temperature flag of the temperature management unit corresponding to a write target area in which the temperature at the write process time is lower than the threshold value Tth1 to "True".

On the other hand, if the temperature at the write process time is equal to or higher than the threshold value Tth1 (step ST13; no), the memory controller 30 determines that the temperature at the write process time is not low, and the process proceeds to step ST15. In step ST15, the memory controller 30 sets the low-temperature flag of the temperature management unit corresponding to a write target area in which the temperature at the write process time is equal to or higher than the threshold value Tth1 to "False".

The write process and the update process for the temperature management information 21 involved in the write process are thus finished.

1.2.2 Refresh Reservation Determination Process

Figure 9:
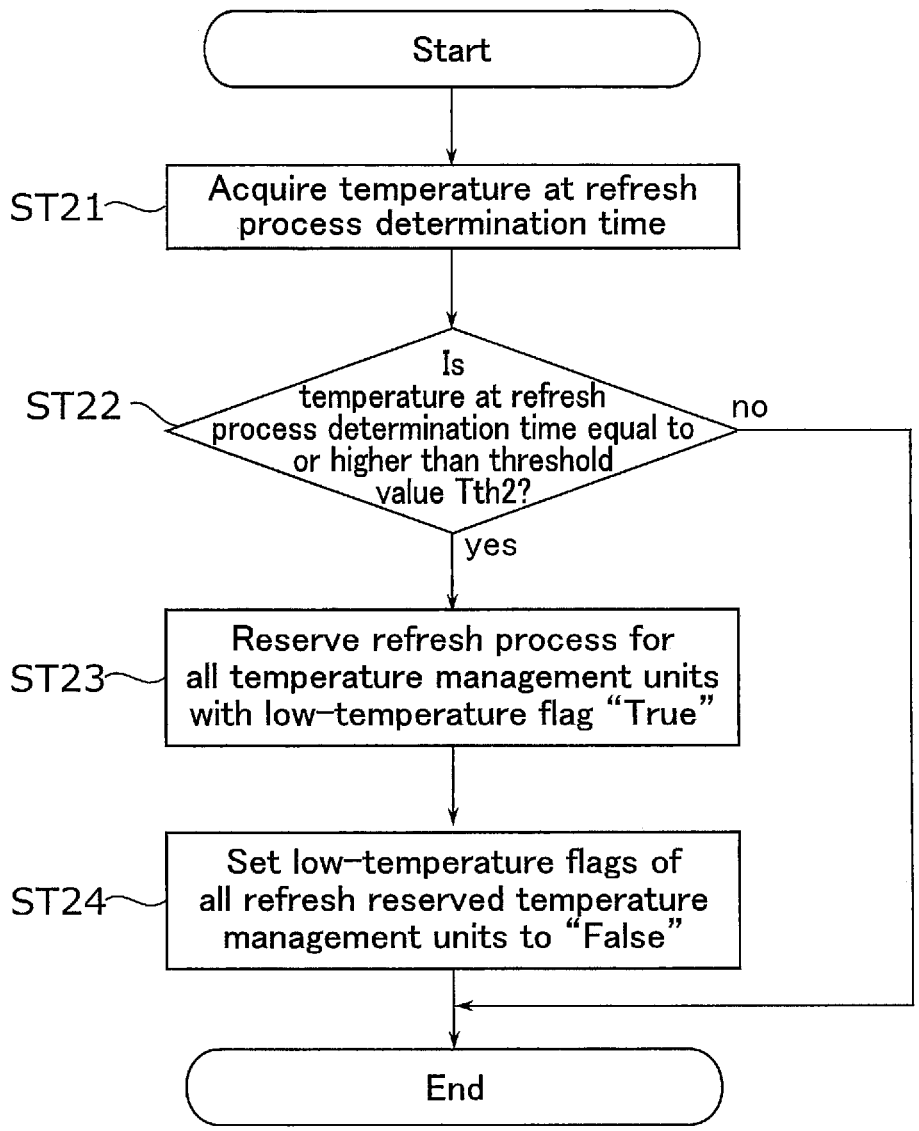
FIG. 9 is a flowchart for explaining a refresh reservation determination process in the memory system according to the first embodiment.

Next, a refresh reservation determination process in the memory system according to the first embodiment will be described. FIG. 9 is a flowchart showing a refresh reservation determination process in the memory system 1 according to the first embodiment. Steps ST21 to ST24 of the refresh reservation determination process shown in FIG. 9 are periodically executed by, for example, the memory controller 30.

As shown in FIG. 9, in step ST21, the memory controller 30 acquires information on temperature used when determining whether to reserve a refresh process (hereinafter referred to as "the temperature at the refresh process determination time") from the NAND flash memory 10. Note that when acquiring the temperature at the refresh process determination time, the memory controller 30 acquires one temperature at one time point as the temperature at the refresh process determination time. Thus, the method for acquiring the temperature at the refresh process determination time differs from the method for acquiring the temperature at the write process time, in which a representative value of a plurality of temperatures is acquired over a certain period of time.

In step ST22, the memory controller 30 determines whether or not the temperature at the refresh process determination time acquired in step ST21 is equal to or higher than a threshold value Tth2. The memory controller 30 uses the threshold value Tth2 as a threshold to determine whether the temperature at the refresh process determination time has significantly increased from the temperature at the write process time for a temperature management unit with the low-temperature flag "True". The threshold value Tth2 is higher than the threshold value Tth1 (i.e., Tth2>Tth1).

If the temperature at the refresh process determination time is equal to or higher than the threshold value Tth2 (step ST22; yes), the process proceeds to step ST23. If the temperature at the refresh process determination time is lower than the threshold value Tth2 (step ST22; No), steps ST23 and ST24 are omitted.

In step ST23, the memory controller 30 reserves the refresh process for all temperature management units with the low-temperature flag "True". Specifically, the memory controller 30 selects all temperature management units with the low-temperature flag "True" with reference to the temperature management information 21. Then, the memory controller 30 stores information that the refresh process for blocks BLK which include all selected temperature management units is reserved, in the refresh reservation information 22.

In step ST24, the memory controller 30 sets the low-temperature flags of all temperature management units for which the refresh process has been reserved to "False".

The refresh reservation determination process is thus finished.

The memory controller 30 may execute the reserved refresh process at any timing.

Specifically, for example, the memory controller 30 issues a read command set including the address of a refresh process target block BLK, and sends the read command set to the NAND flash memory 10. Upon receipt of the read command set, the NAND flash memory 10 reads data from the refresh process target block BLK, and outputs the read data to the memory controller 30. Upon receipt of the read data from the NAND flash memory 10, the ECC circuit 34 in the memory controller 30 executes an error correction process for the read data, and acquires the error-corrected data.

The memory controller 30 issues a write command set including the error-corrected data, and sends the write command set to the NAND flash memory 10. Upon receipt of the write command set, the NAND flash memory 10 writes the error-corrected data in another block BLK different from the refresh process target block BLK. Alternatively, the NAND flash memory 10 erases the written data from the refresh process target block BLK, and thereafter writes the error-corrected data in the refresh process target block BLK. Then, the memory controller 30 invalidates the information indicative of the refresh process target block BLK from the refresh reservation information 22.

The refresh process is thus finished.

1.2.3 Relationship Between State and Temperature of Memory System

Figure 10:
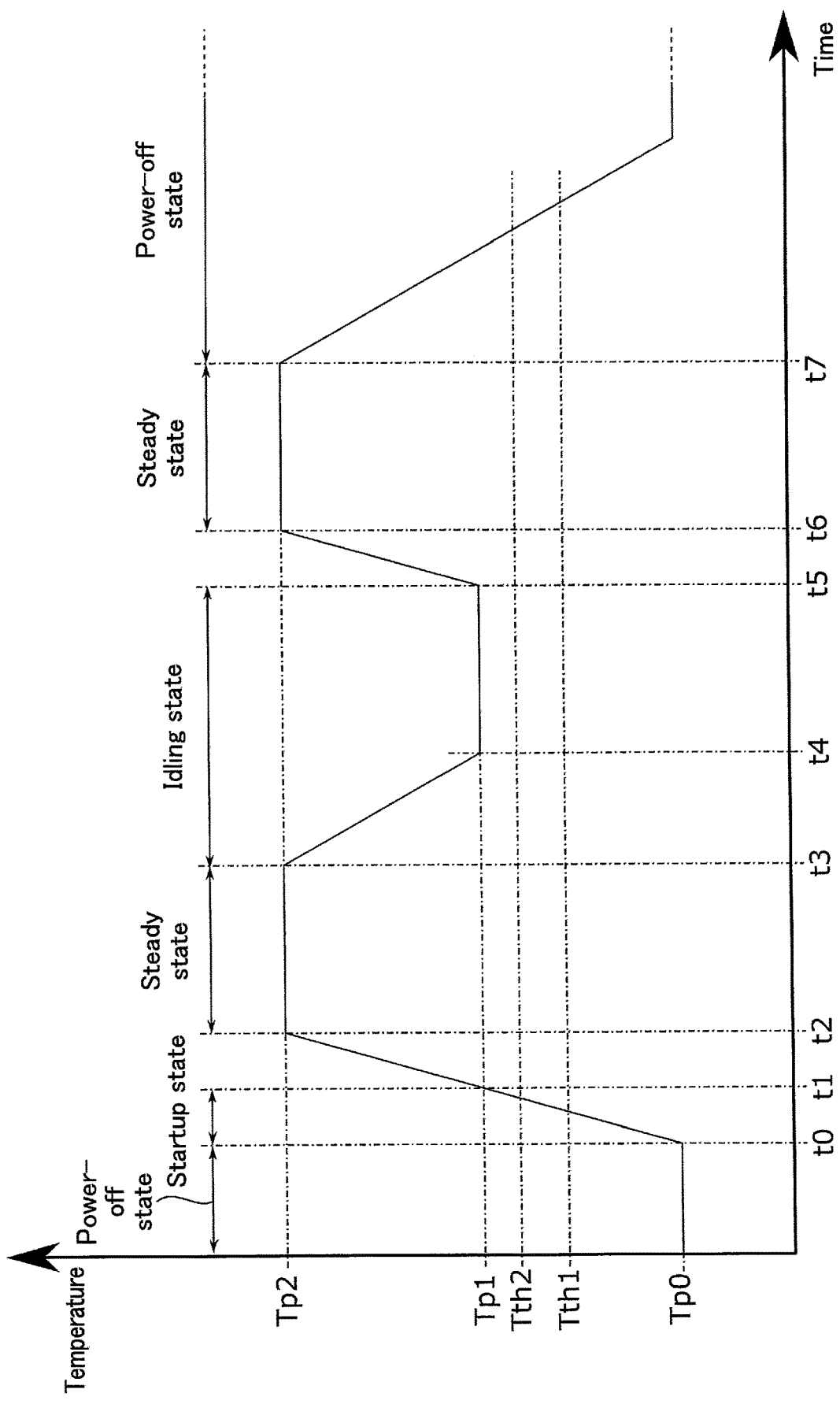
FIG. 10 is a diagram for explaining a relationship between a temperature transition and a state of the memory system according to the first embodiment.

FIG. 10 is a diagram showing a relationship between a state and a temperature transition of the memory system 1 according to the first embodiment. FIG. 10 shows an example of a sequence from starting up of the memory system 1 of a power-off state to returning to the power-off state again, and a temperature change in the memory system 1 involved in the transition of the state in a time-series manner.

As shown in FIG. 10, the memory system 1 is in the power-off state until a time t0. In the power-off state, the memory system 1 is maintained at a temperature Tp0. The temperature Tp0 is a temperature of roman environment where the memory system 1 is placed, for example, 5° C. The temperature Tp0 may be 20° C. or 25° C., and not limited to these examples since it may be set by a user.

At the time t0, power supply to the memory system 1 is started. Accordingly, the memory system 1 executes a startup process, such as a power-on read process. Furthermore, the memory system 1 executes, for example, a host process that includes a read process and a write process in accordance with a request from the host device 2. The memory system 1 also executes a background process that is a process not based on a request from the host device 2 when necessary. Thus, the temperature of the memory system 1 increases from the temperature Tp0, and reaches a temperature Tp1 (>Tp0) at a time t1. The temperature Tp1 is, for example, 45° C. In FIG. 10, a state of the memory system 1 in a period when the temperature of the memory system 1 is equal to or higher than the temperature Tp0 and equal to or lower than the temperature Tp1 is referred to as a "startup state".

Subsequently, when the host process and the background process are executed, the temperature of the memory system 1 still increases after the time t1 and reaches the temperature Tp2 (>Tp1) at a time t2. The temperature Tp2 is, for example, 70° C. Then, in a period from the time t2 to a time t3, heat generated by execution of the host process and the background process balances with heat discharged through a temperate control mechanism (not shown), and the temperature of the memory system 1 becomes stable at the temperature Tp2. In FIG. 10, a state of the memory system 1 in a period from the time t2 to the time t3 when the temperature of the memory system 1 is stable is referred to as a "steady state".

At the time t3, the temperature of the memory system 1 starts decreasing, for example, because of an absence of a request from the host device 2. Since the background process is still executed after the time t3, the temperature of the memory system 1 becomes stable again at a time t4 at the temperature Tp1. In FIG. 10, a period from the time when the temperature of the memory system 1 starts decreasing from the temperature Tp2 to a time t5 when the temperature is maintained stable at the temperature Tp1 is referred to as an "idling state". The temperature Tp1 may be the lowest temperature of all the states in which the temperature is stable in the power-on state of the memory system 1. The memory system 1 may set the threshold value Tth1 to a temperature lower than the temperature Tp1.

At the time t5, the host process is executed again. Accordingly, the temperature of the memory system 1 increases and reaches the temperature Tp2 at a time t6. In a period from the time t6 to a time t7, the memory system 1 is in the steady state again.

At the time t7, the power supply to the memory system 1 is stopped, and the memory system 1 is in the power-off state. Accordingly, the host process and the background process in the memory system 1 are stopped and the temperature of the memory system 1 decreases to the temperature Tp0.

The sequence of the memory system 1 is thus finished.

Based on the temperatures Tp0 to Tp2 in the respective states in the sequence shown in FIG. 10, the memory controller 30 sets the threshold values Tth1 and Tth2 between the temperatures Tp0 and Tp1. The threshold value Tth2 is lower than the temperature Tp1, and set to a range, for example, between 30° C. and 40° C. (30° C.<Tth2<40° C.) The threshold value Tth1 is lower than the threshold value Tth2, and set to a range, for example, between 10° C. and 30° C. (10° C.<Tth1<30° C.). As a result, the memory controller 30 can avoid the refresh process being endlessly repeated in the steady state and the idling state.

1.3 Effects of Present Embodiment

According to the first embodiment, when the temperature at the write process time of a certain storage area is lower than the threshold value Tth1 and the temperature of the certain storage area after the write process is equal to or higher than the threshold value Tth2, the memory controller 30 reserves the refresh process for the certain storage area.

Accordingly, in a read process in the steady state (or the idling state) of data that has been written in the startup state, it is possible to rewrite at a higher temperature the data that has been written in the startup state before the number of error bits included in the read data exceeds the correction capability by the soft decision decoding of the ECC circuit 34. For this reason, the variation in the threshold voltage distributions due to a difference in temperatures between the write process and the read process can be suppressed, so that the increase in the number of error bits included in the read data can be suppressed. Therefore, deterioration in the reliability of data can be suppressed.

As a supplemental explanation, in the sequence shown in FIG. 10, the difference in temperatures between the startup state and the steady state is greater than the difference in temperatures between the idling state and the steady state and the difference in temperatures between the startup state and the idling state. Therefore, when data written in the startup state is read in the steady state, the possibility of the reliability of the read data being impaired is higher than when the data written in the idling state (e.g., through the background process) is read in the steady state and when the data written in the startup state is read in the idling state (e.g., through the background process).

According to the first embodiment, in the update process for the temperature management information 21, the memory controller 30 sets the low-temperature flag "True" for each temperature management unit with respect to the storage area in which data is written when the temperature of the NAND flash memory 10 is lower than the threshold value. Tth1. As a result, the memory controller 30 can specify a storage area in which data is written in a low-temperature state, particularly near the temperature Tp0, in the startup state. Furthermore, in the refresh reservation determination process, the memory controller 30 reserves the refresh process for all temperature management units to which the low-temperature flag "True" is set, when the temperature of the NAND flash memory 10 is equal to or higher than the threshold value Tth2. For this reason, until the memory system 1 becomes the steady state (for example, in the idling state), the memory controller 30 can reserve execution of the refresh process for all temperature management units to which the low-temperature flag "True" is set. Therefore, it is possible to avoid the situation in which the number of error bits that are detected when data written in a low-temperature time is read in a high-temperature time exceeds the correction capability by the soft decision decoding of the ECC circuit 34.

2. Second Embodiment

Next, a memory system according to a second embodiment will be described. The second embodiment differs from the first embodiment in that threshold values are not individually set for the temperature at the refresh process determination time and the temperature at the write process time. Instead, in the second embodiment, a threshold value is set for a difference between the temperature at the refresh process determination time and the temperature at the write process time. Hereinafter, descriptions of the same configurations and operations as those of the first embodiment will be omitted, and the configurations and operations different from those of the first embodiment will be mainly described.

2.1 Temperature Management Information

FIG. 11 is a conceptual diagram illustrating an example of the configuration of the memory system according to the second embodiment, and corresponds to FIG. 6 in the first embodiment.

As shown in FIG. 11, temperature management information 21A stores the temperature at the write process time, instead of the low-temperature flag, for each temperature management unit in all storage areas in the NAND flash memory 10.

The example of FIG. 11 shows a case where temperatures T0 to T7 at the write process times are stored in association with word lines WL0 to WL7 in block BLK0 of a chip Chip0. With reference to the information, the memory controller 30 can specifically ascertain the temperature at the write process time in each temperature management unit.

2.2 Update Process for Temperature Management Information

Figure 12:
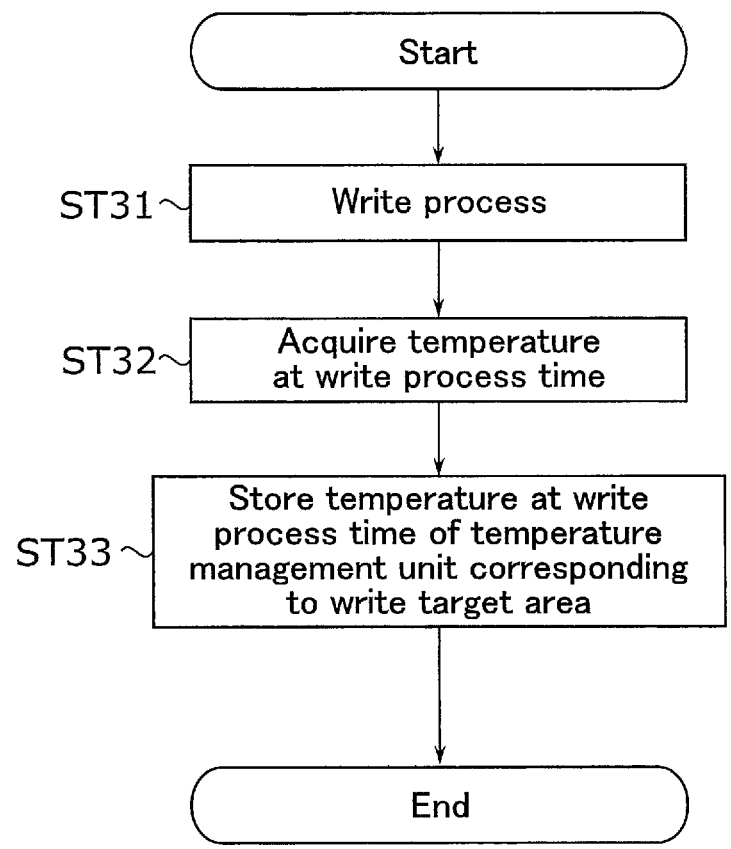
FIG. 12 is a flowchart for explaining an update process for the temperature management information in the memory system according to the second embodiment.

FIG. 12 is a flowchart showing an update process for the temperature management information 21A in the memory system according to the second embodiment, and corresponds to FIG. 8 in the first embodiment.

As shown in FIG. 12, in step ST31, the memory system 1 performs a write process. As the details of the write process are similar to those of step ST11 in FIG. 8, description thereof is omitted.

In step ST32, the memory controller 30 acquires the temperature at the write process time from the NAND flash memory 10. As the process of acquiring the temperature at the write process time is similar to that of step ST12 in FIG. 8, description thereof is omitted.

In step ST33, the memory controller 30 stores the temperature at the write process time of the temperature management unit corresponding to a write target area.

The update process for the temperature management information 21A is thus finished.

2.3 Refresh Reservation Determination Process

Figure 13:
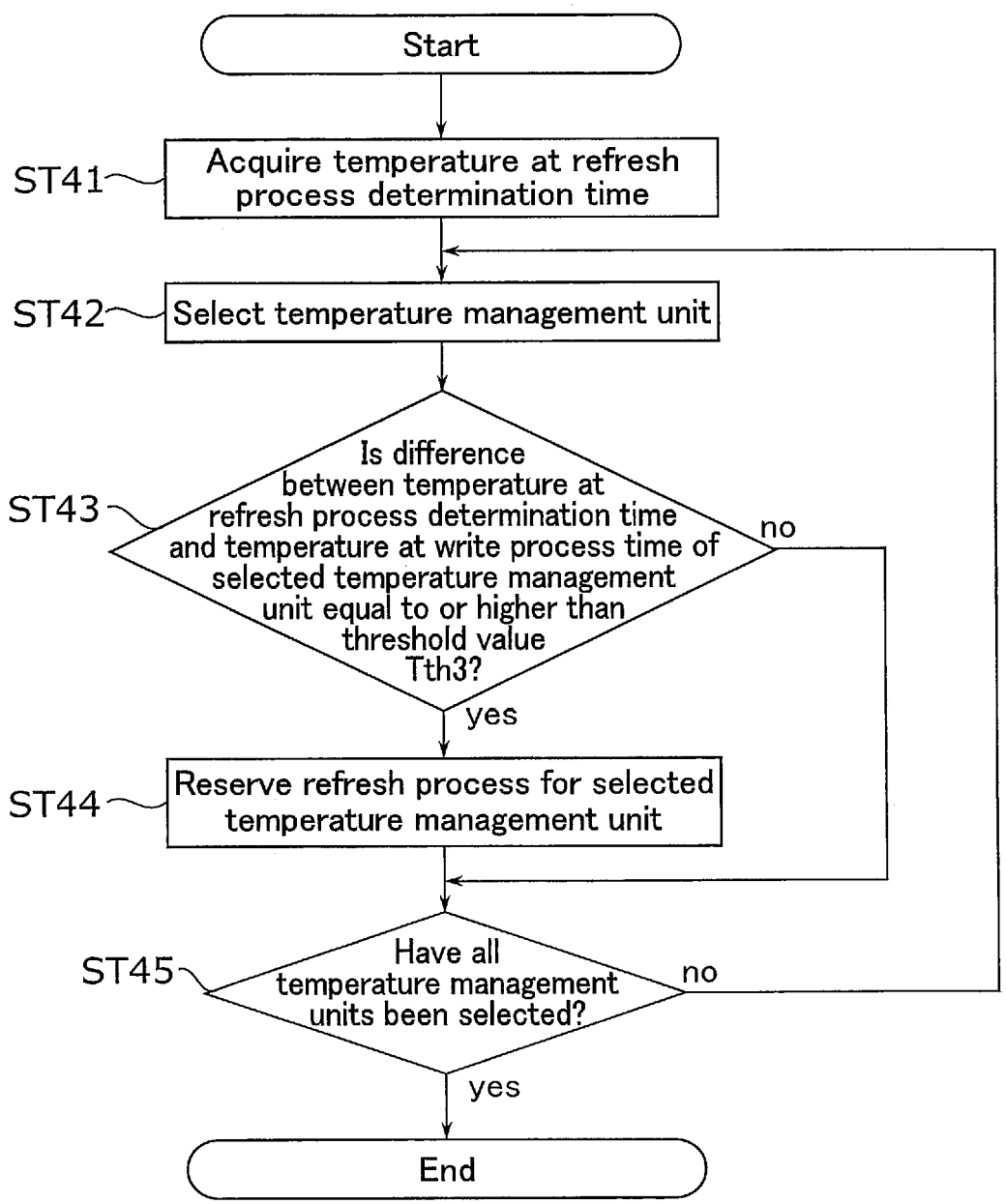
FIG. 13 is a flowchart for explaining a refresh reservation determination process in the memory system according to the second embodiment.

FIG. 13 is a flowchart showing a refresh reservation determination process in the memory system according to the second embodiment, and corresponds to FIG. 9 in the first embodiment. Steps ST41 to ST45 of the refresh reservation determination process shown in FIG. 13 are periodically executed by, for example, the memory controller 30.

As shown in FIG. 13, in step ST41, the memory controller 30 acquires the temperature at the refresh process determination time. As the process of acquiring the temperature at the refresh process determination time is similar to that of step ST21 in FIG. 9, description thereof is omitted.

In step ST42, the memory controller 30 selects, with reference to the temperature management information 21A, a temperature management unit for which the temperature at the write process time is stored.

In step ST43, the memory controller 30 determines whether or not the difference between the temperature at the refresh process determination time acquired in step S41 and the temperature at the write process time of the temperature management unit selected in step ST42 is equal to or higher than a threshold value Tth3. The threshold value Tth3 may be set, for example, within a range in which variation of the threshold voltage distribution due to a difference between the temperature at the write process time and a temperature at the read process time is permissible. The variation of the threshold voltage distribution is permissible if the number of error bits that occur due to the variation of the threshold voltage distribution is equal to or less than the number of error bits that can be corrected by the error correction process by the ECC circuit 34.

If the difference is equal to or greater than the threshold value Tth3 (step ST43; yes), the process proceeds to step ST44. If the difference is smaller than the threshold value Tth3 (step ST43; no), step ST44 is omitted and the process proceeds to step ST45.

In step ST44, the memory controller 30 stores, in the refresh reservation information 22, information that the refresh process for a block BLK that includes the temperature management unit selected in step ST42 is reserved, and thus reserves the refresh process.

In step ST45, the memory controller 30 determines whether all temperature management units managed in the temperature management information 21A have been selected. If there is a temperature management unit that has not been selected (step ST45; no), the process returns to step ST42. In this manner, steps ST42 to ST45 are repeated until all temperature management units are selected. If all temperature management units have been selected (step ST45; yes), the refresh reservation determination process is finished.

2.4 Effects of Present Embodiment

According to the second embodiment, when a temperature management unit has a difference between the temperature at the refresh process determination time and the temperature at the write process time equal to or greater than the threshold value Tth3, the memory controller 30 reserves the refresh process for that temperature management unit. Accordingly, a storage area which may have been brought to a state in which the variation of the threshold voltage is not permissible can be detected for each temperature management unit. Thus, since the memory controller 30 can determine whether to reserve the refresh process for each temperature management unit, more adaptive control can be performed.

3. Third Embodiment

Next, a memory system according to a third embodiment will be described. The third embodiment differs from the first and second embodiments in that even if the temperature at the write process time and the temperature at the refresh process determination time satisfy a condition, some temperature management units are not reserved for the refresh process. Hereinafter, descriptions of the same configurations and operations as those of the second embodiment will be omitted, and the configurations and operations different from those of the second embodiment will be mainly described.

3.1 Temperature Management Information

FIG. 14 is a conceptual diagram illustrating an example of the configuration of the memory system according to the third embodiment, and corresponds to FIG. 11 in the second embodiment.

As shown in FIG. 14, the temperature management information 21B stores an exclusion flag along with the temperature at the write process time for each temperature management unit in all storage areas in the NAND flash memory 10. The exclusion flag is a flag to determine whether to reserve a refresh process for a storage area in the corresponding temperature management unit, even if the temperature at the write process time and the temperature at the refresh process determination time satisfy a condition.

If whether the temperature at the write process time and the temperature at the refresh process determination time satisfy the condition is not taken into consideration when the refresh process is reserved, "True" is stored in the exclusion flag. If whether the temperature at the write process time and the temperature at the refresh process determination time satisfy the condition is taken into consideration when the refresh process is reserved, "False" is stored in the exclusion flag.

In the example of FIG. 14, "False" is set to six exclusion flags associated with the word lines WL0 to WL2 and WL5 to WL7 in the block BLK0 of the chip Chip0, while "True" is set to two exclusion flags associated with the word lines WL3 and WL4. With reference to the information, the memory controller 30 recognizes that the temperature at the write process time is not taken into consideration when determining whether to reserve the refresh process for the memory cells coupled to the word lines WL3 and WL4 in the block BLK0 of the chip Chip0.

3.2 Update Process for Temperature Management Information

Next, examples of an update process for temperature management information in the memory system according to the third embodiment will be described.

3.2.1 First Example

A first example of the update process for the temperature management information is described first. In the first example, the exclusion flag is set on the basis of a state in which an access to a write target area may occur.

Figure 15:
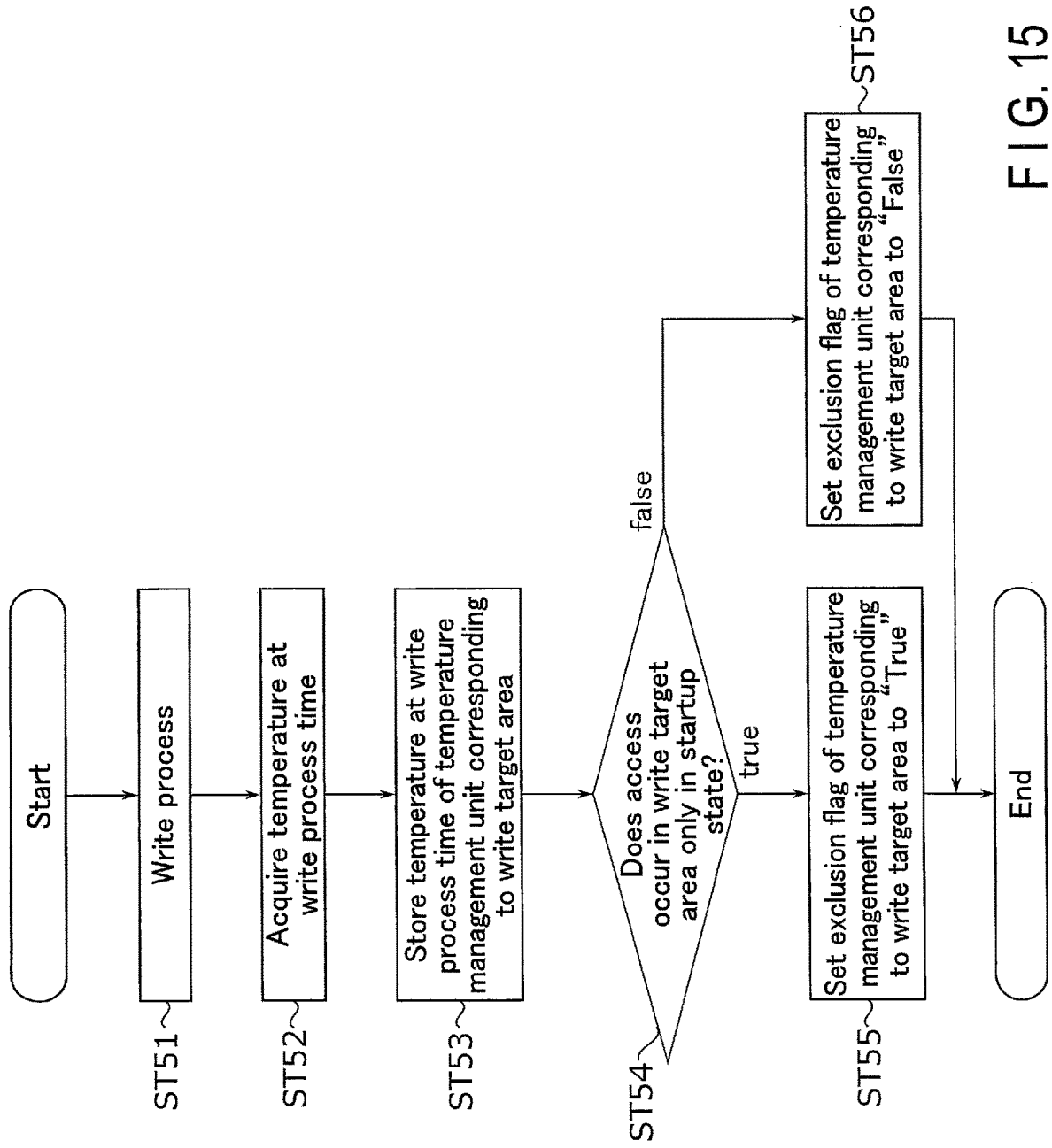
FIG. 15 is a flowchart for explaining a first example of an update process for the temperature management information in the memory system according to the third embodiment.

FIG. 15 is a flowchart showing the first example of the update process for the temperature management information 21B in the memory system according to the third embodiment, and corresponds to FIG. 12 in the second embodiment.

In steps ST51 to ST53, the memory controller 30 executes the write process and stores, in the temperature management information 21B, the temperature at the write process time of the temperature management unit corresponding to a write target area. As the processes of steps ST51 to ST53 are similar to the processes of steps ST31 to ST33 shown in FIG. 12 of the second embodiment, description thereof is omitted.

In step ST54, the memory controller 30 determines whether or not the write target area is a storage area in which an access to the NAND flash memory 10 (for example, the write process, the read process) occurs only in the startup state.

If the access occurs only in the startup state in the write target area (step ST54; true), the process proceeds to step ST55. In step ST55, the memory controller 30 sets the exclusion flag of the temperature management unit corresponding to the write target area to "True".

On the other hand, if the access will occur in the idling state and the steady state in the write target area (step ST54; false), the process proceeds to step ST56. In step ST56, the memory controller 30 sets the exclusion flag of the temperature management unit corresponding to the write target area to "False".

The memory controller 30 may discriminate in advance between data to which an access does not occur in the steady state and the idling state (e.g., an access occurs only in the startup state) and data to which an access will occur in the steady state and the idling state. The memory controller 30 may then store the discriminated data in different storage areas in the NAND flash memory 10. In other words, the memory controller 30 can set the exclusion flag of the temperature management unit corresponding to the write target area based on the address of the write target area. The data to which an access does not occur in the steady state and the idling state is assumed to be, for example, system data that is read in a power-on read process. The storage area to which an access does not occur in the steady state and the idling state is assumed to be, for example, a system data area to store the system data. Accordingly, the memory controller 30 can determine, for each temperature management unit managed in the temperature management information 21B, whether the temperature management unit is a storage area that will be accessed only in the startup state based on the address of the write target area.

The update process for the temperature management information 21B is thus finished.

In step ST54, the memory controller 30 may further determine whether the frequency of an access to the write target area in the steady state and the idling state is less than a threshold value. Specifically, if the frequency of the access to the write target area in the steady state and the idling state is lower than the threshold value (ST54; true), the process proceeds to step ST55. If the frequency is equal to or higher than the threshold value (ST54; false), the process proceeds to step ST56. Through the operation described above, for example, if the background process is executed at a low frequency while the host process is not executed, the refresh process is not reserved. The example in which the background process is executed at a low frequency while the host process is not executed is assumed to be, for example, a read process executed at regular or irregular intervals to confirm whether data is read correctly (i.e., patrol process) or the like.

In step ST54, the memory controller 30 may further determine whether an exclusion flag is set in the write target area in accordance with an intended use of the write target area. Specifically, if the write target area is a storage area for storing data that is assumed to be accessed at a low frequency in the steady state and the idling state (ST54; true), the process proceeds to step ST55. If the write target area is a storage area for storing data that is assumed to be accessed at a high frequency (ST54; false), the process proceeds to step ST56. Through the operation described above, the memory controller 30 can determine whether to set the exclusion flag in accordance with the intended use of the storage area in the NAND flash memory 10 set in advance, for example, when the memory controller 30 is designed, not in accordance with the access frequency based on actual accesses.

3.2.2 Second Example

Next, a second example of the update process for the temperature management information is described. In the second example, the exclusion flag is set on the basis of a write mode. Specifically, the exclusion flag is set to "False" for a write mode in which a margin between threshold voltage distributions is relatively small, whereas the exclusion flag is set to "True" for a write mode in which the margin between threshold voltage distributions is relatively large.

Figure 16:
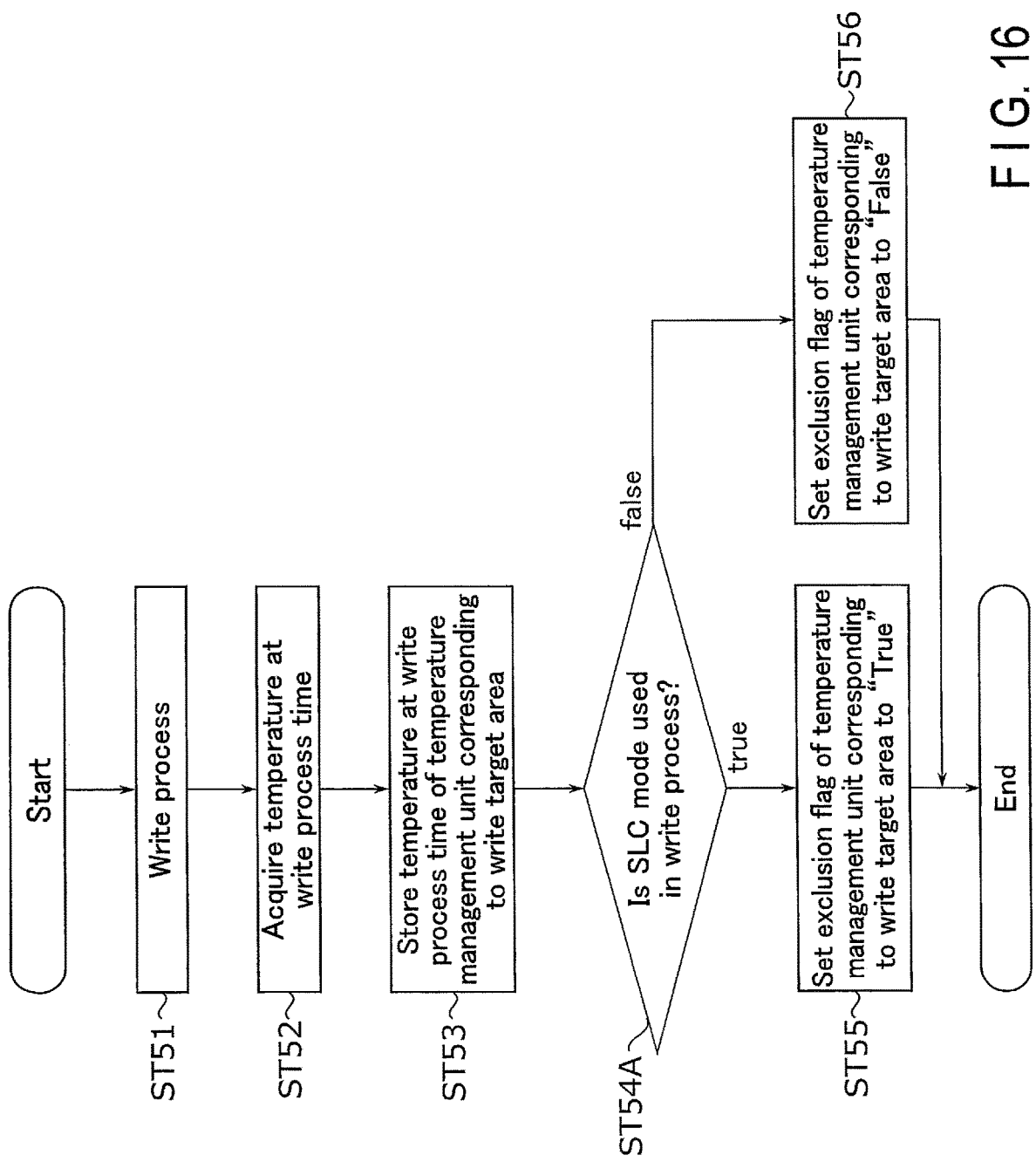
FIG. 16 is a flowchart for explaining a second example of the update process for the temperature management information in the memory system according to the third embodiment.

FIG. 16 is a flowchart showing the second example of the update process for the temperature management information 21B in the memory system according to the third embodiment.

In steps ST51 to ST53, the memory controller 30 executes the write process, and stores, in the temperature management information 21B, the temperature at the write process time of the temperature management unit corresponding to the write target area. As the processes of steps ST51 to ST53 are similar to those of the first example, description thereof is omitted.

In step ST54A, the memory controller 30 determines whether or not the SLC mode is used for the write process.

If the SLC mode is used, namely, if 1-bit data is written in a memory cell transistor MT, (step ST54A; true), the process proceeds to step ST55. In step ST55, the memory controller 30 sets the exclusion flag of the temperature management unit corresponding to the write target area to "True".

On the other hand, if the SLC mode is not used, namely, if 2 or more-bit data is written in a memory cell transistor MT, (step ST54A; false), the process proceeds to step ST56. In step ST56, the memory controller 30 sets the exclusion flag of the temperature management unit corresponding to the write target area to "False".

The update process for the temperature management information 21B is thus finished.

In the case of FIG. 16 described above, the memory controller 30 sets the exclusion flag to "True" if the write mode is the SLC mode; however, the embodiment is not limited to this case. For example, the memory controller 30 may set the exclusion flag to "True" if the write mode is the SLC mode or the MLC mode. In this case, the memory controller 30 sets the exclusion flag to "False" if the write mode is the TLC mode or the QLC mode.

3.3 Refresh Reservation Determination Process

Figure 17:
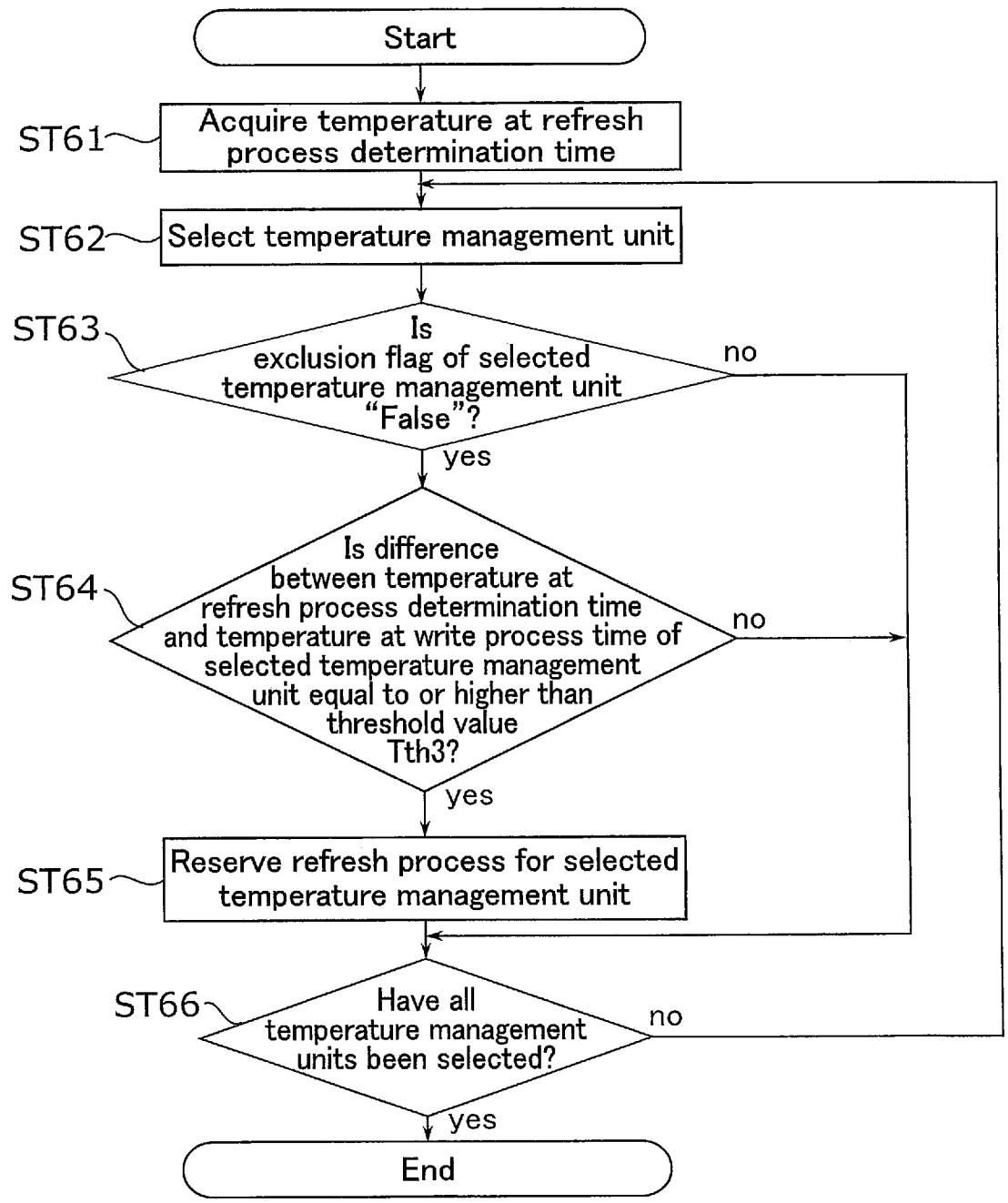
FIG. 17 is a flowchart for explaining a refresh reservation determination process in the memory system according to the third embodiment.

FIG. 17 is a flowchart showing a refresh reservation determination process in the memory system according to the third embodiment, and corresponds to FIG. 13 in the second embodiment. Steps ST61 to ST66 of the refresh reservation determination process shown in FIG. 17 are periodically executed by, for example, the memory controller 30.

As shown in FIG. 17, in step ST61, the memory controller 30 acquires the temperature at the refresh process determination time. As the details of the process of acquiring the temperature at the refresh process determination time are similar to those of step ST41 in FIG. 13, description thereof is omitted.

In step ST62, the memory controller 30 refers to the temperature management information 21B, and selects a temperature management unit for which the temperature at the write process time is stored.

In step ST63, the memory controller 30 determines whether the exclusion flag of the temperature management unit selected in step ST62 is "False". If the exclusion flag is "False" (step ST63; yes), the process proceeds to step ST64. If the exclusion flag is "True" (step ST63; no), the process proceeds to step ST66.

In step ST64, the memory controller 30 determines whether or not a difference between the temperature at the refresh process determination time acquired in step ST61 and the temperature at the write process time of the temperature management unit selected in step ST62 is equal to or higher than the threshold value Tth3. As the details of the determination process based on the threshold value Tth3 are similar to those of step ST43 in FIG. 13, description thereof is omitted.

If the difference is equal to or greater than the threshold value Tth3 (step ST64; yes), the process proceeds to step ST65. If the difference is smaller than the threshold value Tth3 (step ST64; no), step ST65 is omitted and the process proceeds to step ST66.

In step ST65, the memory controller 30 stores, in the refresh reservation information 22, information that the refresh process for a block BLK that includes the temperature management unit selected in step ST62 is reserved, and thus reserves the refresh process.

In step ST66, the memory controller 30 determines whether all temperature management units managed in the temperature management information 21B have been selected. If there is a temperature management unit that has not been selected (step ST66; no), the process returns to step ST62. In this manner, steps ST62 to ST66 are repeated until all temperature management units are selected. If all temperature management units have been selected (step ST66, yes), the refresh reservation determination process is finished.

3.4 Effects of Present Embodiment

According to the third embodiment, in the update process for the temperature management information 21B, the memory controller 30 sets an exclusion flag in accordance with the address of the temperature management unit. In the refresh reservation determination process, the memory controller 30 does not reserve a refresh process for the temperature management unit with the exclusion flag "True" even if the temperature at the refresh process determination time and the temperature at the write process time satisfy the condition. Thus, execution of the refresh process can be omitted even for data written in the low-temperature state if there is no possibility of the data being read in a high-temperature state, in which the threshold voltage distribution varies more significantly than the low-temperature state. Therefore, the increase of the frequency of the background process by executing the refresh process can be suppressed. Accordingly, it is possible to suppress the decrease in response performance of the memory system 1 upon a request from the host device 2. It is also possible to avoid a risk of impairing the reliabilities of read data, which may occur when the system data is rewritten in a high-temperature state by the refresh process and is read in the startup state by the startup process.

4. Fourth Embodiment

Next, a memory system according to a fourth embodiment will be described. The fourth embodiment differs from the first to third embodiments in that the criterion for determination in the refresh reservation determination process is changed in accordance with a degree of wear-out of the NAND flash memory 10. Hereinafter, descriptions of the same configurations and operations as those of the second embodiment will be omitted, and the configurations and operations different from those of the second embodiment will be mainly described.

4.1 Refresh Reservation Determination Process

Figure 18:
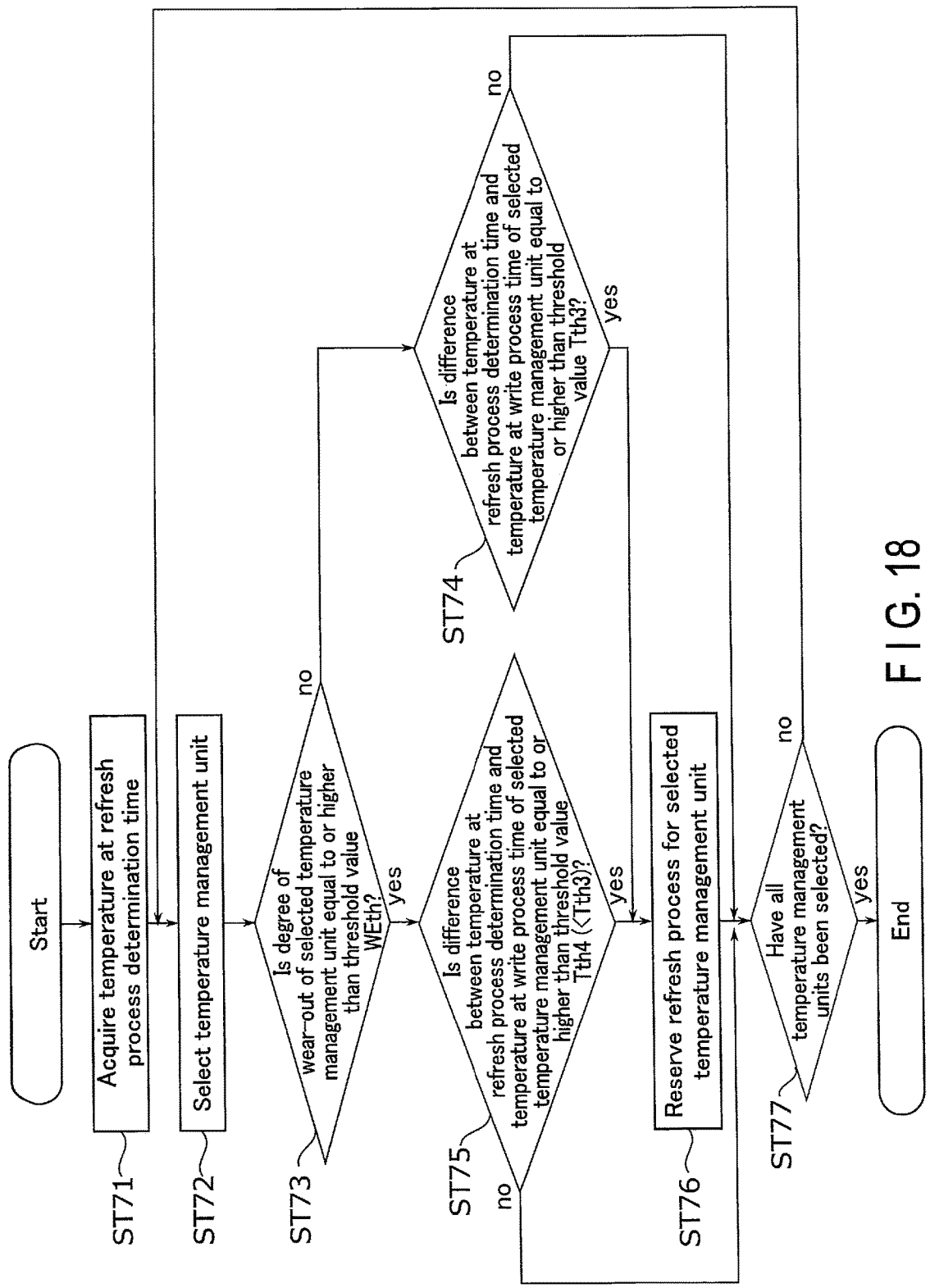
FIG. 18 is a flowchart for explaining a refresh reservation determination process in a memory system according to a fourth embodiment.

FIG. 18 is a flowchart showing a refresh reservation determination process in the memory system according to the fourth embodiment, and corresponds to FIG. 13 in the second embodiment. Steps ST71 to ST77 of the refresh reservation determination process shown in FIG. 18 are periodically executed by, for example, the memory controller 30.

As shown in FIG. 18, in step ST71, the memory controller 30 acquires the temperature at the refresh process determination time. As the details of the process of acquiring the temperature at the refresh process determination time are similar to those of step ST41 in FIG. 13, description thereof is omitted.

In step ST72, the memory controller 30 selects a temperature management unit in which the temperature at the write process time is stored.

In step ST73, the memory controller 30 determines whether the degree of wear-out of the temperature management unit selected in step ST72 is equal to or higher than a threshold value WEth. The degree of wear-out may include an index relating to an ease of shift and spread of the threshold voltage distribution and may be the number of write-and-erase (W/E) cycles, which may also be referred to as the number of program-and-erase (P/E) cycles, of the temperature management unit. The number of W/E cycles is managed by the memory controller 30, for example, in units of blocks BLK.

If the degree of wear-out is lower than the threshold value WEth (step ST73; no), the process proceeds to step ST74. In step ST74, the memory controller 30 determines whether or not a difference between the temperature at the refresh process determination time acquired in step ST71 and the temperature at the write process time of the temperature management unit selected in step ST72 is equal to or higher than the threshold value Tth3.

If the difference is equal to or greater than the threshold value Tth3 (step ST74; yes), the process proceeds to step ST76. If the difference is smaller than the threshold value Tth3 (step ST74; no), step ST76 is omitted and the process proceeds to step ST77.

On the other hand, if the degree of wear-out is equal to or higher than the threshold value WEth (step ST73; yes), the process proceeds to step ST75. In step ST75, the memory controller 30 determines whether or not the difference is equal to or higher than a threshold value Tth4, which is smaller than the threshold value Tth3 (i.e., Tth4<Tth3).

If the difference is equal to or greater than the threshold value Tth4 (step ST75; yes), the process proceeds to step ST76. If the difference is smaller than the threshold value Tth4 (step ST75; no), step ST76 is omitted and the process proceeds to step ST77.

In step ST76, the memory controller 30 stores, in the refresh reservation information 22, information that the refresh process for a block BLK that includes the temperature management unit selected in step ST72 is reserved, and thus reserves the refresh process.

In step ST77, the memory controller 30 determines whether all temperature management units have been selected. If there is a temperature management unit that has not been selected (step ST77; no), the process returns to step ST72. In this manner, steps ST72 to ST77 are repeated until all temperature management units are selected. If all temperature management units have been selected (step ST77; yes), the refresh reservation determination process is finished.

In the case of FIG. 18 described above, the process for determining whether to execute the refresh reservation (step ST74 or ST75) is executed even if the value of the degree of wear-out is relatively low; however, the embodiment is not limited to this case. For example, if the degree of wear-out is lower than the threshold value WEth (step ST73; no), step ST74 may be omitted and the process may proceed to step ST77.

4.2 Effects of Present Embodiment

According to the fourth embodiment, the memory controller 30 sets the threshold Tth to a smaller value as the degree of wear-out increases. As a result, with regard to a temperature management unit with a higher degree of wear-out, the memory controller 30 can determine that reservation of the refresh process is necessary when a difference between the temperature at the refresh process determination time and the temperature at the write process time is smaller. Therefore, even for a temperature management unit having a threshold voltage distribution that is easily shifted or spread due to repeated use, the refresh process can be reserved at an appropriate timing before the number of error bits exceeds the error correction capability by the soft decision decoding of the ECC circuit 34. Therefore, the deterioration of the reliability of data can be suppressed.

5. Modifications

The first to fourth embodiments are not limited to the examples described above, and may be modified in various ways.

For example, in the first to fourth embodiments described above, the memory controller 30 acquires temperature measured by the temperature sensor 15 in the NAND flash memory 10 in the update process for the temperature management information 21; however, the embodiments are not limited to this example. The memory controller 30 may acquire temperature from, for example, an outside of the NAND flash memory 10. For example, the temperature may be acquired by an analog to digital converter (ADC) or the like within the memory controller 30. In this case, the memory controller 30 may estimate the temperature in the NAND flash memory 10, in particular, in the memory cell array 17 by appropriately correcting the acquired temperature, and execute the update process for the temperature management information 21 based on the estimated temperature.

Furthermore, in the first to fourth embodiments described above, the temperature management units are four cell units CU coupled in common to the word line WL; however, the embodiments are not limited to this example. For example, the temperature management units may be three or fewer cell units CU, or may be five or more cell units CU associated with a plurality of word lines WL. The five or more cell units CU associated with the word lines WL are also referred to as a word line group. Alternatively, for example, the temperature management unit may be one block BLK or a plurality of blocks BLK. If the temperature management units are a plurality of blocks BLK, the blocks BLK included in the same temperature management unit may respectively belong to different chips. Furthermore, if the temperature management units are a plurality of blocks BLK, the blocks BLK included in the same temperature management unit may respectively belong to different planes PB in the same chip Chip.

A plurality of blocks BLK as the temperature management units may be a logical block BLK. The logical block may include the blocks BLK over a plurality of chips Chip and include an error correction frame constituting an inter-block parity. A set of corresponding word lines WL in the chips Chip constituting the logical block is also referred to as a logical word line. The temperature management unit may be a plurality of cell units CU associated with the logical word line. The temperature management unit may also be a plurality of cell units CU associated with a plurality of logical word lines. A set of a plurality of cell units CU associated with a plurality of logical word lines WL is also referred to as a logical word line group.

The memory controller 30 may change the temperature management units to various sizes as described above. Accordingly, the storage capacity necessary for the temperature management information 21 and the reservation unit of the refresh process can be adjusted appropriately in accordance with the state of the NAND flash memory 10.

The third embodiment and the fourth embodiment are described as being applied to the second embodiment, but may be applied to the first embodiment. If the fourth embodiment is applied to the first embodiment, in steps ST74 and ST75 shown in FIG. 17, the memory controller 30 may change, in accordance with the degree of wear-out, the threshold value for use in comparison with the temperature at the refresh process determination time. Specifically, if the degree of wear-out is lower than the threshold WEth, the memory controller 30 determines whether the temperature at the refresh process determination time is equal to or higher than the threshold Tth2. If the degree of wear-out is equal to or higher than the threshold WEth, the memory controller 30 determines whether the temperature at the refresh process determination time is equal to or higher than a threshold Tth5, which is lower than the threshold Tth2 (i.e., Tth5<Tth2).

Alternatively, for example, in steps ST74 and ST75 shown in FIG. 17, the memory controller 30 may change, in accordance with the degree of wear-out, the threshold value for use in comparison with the temperature at the write process time. Specifically, if the degree of wear-out is lower than the threshold WEth, the memory controller 30 determines whether the temperature at the write process time is equal to or lower than the threshold Tth1. If the degree of wear-out is equal to or higher than the threshold WEth, the memory controller 30 determines whether the temperature at the write process time is equal to or lower than a threshold Tth6, which is higher than the threshold Tth1 (i.e., Tth6>Tth1).

Moreover, in the first to fourth embodiments described above, the temperature management information 21 and the refresh reservation information 22 are stored in the DRAM 20; however, the embodiments are not limited thereto. For example, the temperature management information 21 and the refresh reservation information 22 may be stored in a non-volatile manner as appropriate in the NAND flash memory 10 to avoid the situation wherein the information may be lost from the memory system 1 due to unexpected shutdown.

In the first through fourth embodiments, 2-bit data can be stored in a single memory cell transistor MT; however, the embodiments are not limited thereto, and may be configured to store 3-bit data, 4-bit data, or 5-bit data or greater.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system comprising:
a non-volatile memory including a plurality of groups, each of the plurality of groups including a plurality of memory cells, the plurality of groups including at least a first group; and
a memory controller configured to
determine to execute a refresh process for the first group when a first temperature in a write process for the first group is equal to or lower than a first threshold value and a second temperature after the write process for the first group is equal to or higher than a second threshold value, the second threshold value being higher than the first threshold value.

2. The memory system according to claim 1, wherein the memory controller is configured to
make the second threshold value lower upon a degree of wear-out of the first group being equal to or higher than a third threshold value.

3. The memory system according to claim 2, wherein the degree of wear-out of the first group is the number of write-and-erase cycles with respect to the first group.

4. The memory system according to claim 1, wherein the memory controller is configured to
make the first threshold value higher upon a degree of wear-out of the first group being equal to or higher than a third threshold value.

5. The memory system according to claim 4, wherein the degree of wear-out of the first group is the number of write-and-erase cycles with respect to the first group.

6. The memory system according to claim 1, wherein the non-volatile memory includes a plurality of blocks, each of the plurality of blocks including the plurality of groups; and
each of the plurality of blocks is a unit for an erase process.

7. The memory system according to claim 1, wherein each of the plurality of groups is a unit for an erase process.

8. A memory system comprising:
a non-volatile memory including a plurality of groups, each of the plurality of groups including a plurality of memory cells, the plurality of groups including at least a first group; and
a memory controller configured to
determine to execute a refresh process for the first group when a difference between a second temperature after a write process for the first group and a first temperature in the write process for the first group is equal to or greater than a first threshold value.

9. The memory system according to claim 8, wherein the memory controller is configured to
make the first threshold value smaller upon a degree of wear-out of the first group being equal to or higher than a second threshold value.

10. The memory system according to claim 9, wherein the degree of wear-out of the first group is the number of write-and-erase cycles respect to the first group.

11. A memory system comprising:
a non-volatile memory including a plurality of groups, each of the plurality of groups including a plurality of memory cells, the plurality of groups including at least a first group; and
a memory controller configured to:
if the number of bits written in each of the plurality of memory cells in the first group is larger than or equal to a first threshold value, determine whether to execute a refresh process for the first group based on a first temperature in a write process for the first group and a second temperature after the write process for the first group; and
if the number of bits written in each of the plurality of memory cells in the first group is smaller than the first threshold value, determine not to execute the refresh process for the first group regardless of the first temperature or the second temperature.

12. The memory system according to claim 11, wherein the memory controller is further configured to:
if an address of the first group is within a certain range, determine whether to execute the refresh process for the first group based on the first temperature and the second temperature; and
if the address of the first group is out of the certain range, determine not to the refresh process for the first group regardless of the first temperature or the second temperature.

13. The memory system according to claim 11, wherein the memory controller is further configured to:
if a frequency of occurrence of a read process for data written in the first group while the second temperature is equal to or higher than a second threshold value is higher than or equal to a third threshold value, determine whether to execute the refresh process for the first group based on the first temperature and the second temperature; and
if the frequency is lower than the third threshold value, determine not to execute the refresh process for the first group regardless of the first temperature or the second temperature.

14. The memory system according to claim 11, wherein the memory controller is further configured to
if an intended use of the first group is for storing system data, determine not to execute the refresh process for the first group regardless of the first temperature or the second temperature.

15. A memory system comprising:
a non-volatile memory including a plurality of groups, each of the plurality of groups including a plurality of memory cells, the plurality of groups including at least a first group; and
a memory controller configured to:
obtain a plurality of second temperatures by periodically obtaining the second temperature of the non-volatile memory after a write process for the first group; and
determine whether to execute a refresh process for the first group based on a first temperature in the write process for the first group and one of the plurality of second temperatures.

16. The memory system according to claim 15, wherein the memory controller is configured to
determine to execute the refresh process for the first group when the first temperature is equal to or lower than a first threshold value and one of the plurality of second temperatures is equal to or higher than a second threshold value, the second threshold value being higher than the first threshold value.

17. The memory system according to claim 16, wherein the memory controller is configured to
make the second threshold value lower upon a degree of wear-out of the first group being equal to or higher than a third threshold value.

18. The memory system according to claim 17, wherein the degree of wear-out of the first group is the number of write-and-erase cycles with respect to the first group.

19. The memory system according to claim 16, wherein the memory controller is configured to
make the first threshold value higher upon a degree of wear-out of the first group being equal to or higher than a third threshold value.

20. The memory system according to claim 19, wherein the degree of wear-out of the first group is the number of write-and-erase cycles with respect to the first group.

* * * * *